United States Patent
Oh et al.

(10) Patent No.: US 10,910,443 B2
(45) Date of Patent: Feb. 2, 2021

(54) ORGANIC ELECTROLUMINESCENCE DISPLAY DEVICE

(71) Applicant: SAMSUNG DISPLAY CO., LTD., Yongin-si (KR)

(72) Inventors: Ilsoo Oh, Yongin-si (KR); Pyungeun Jeon, Yongin-si (KR); Myungsuk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 389 days.

(21) Appl. No.: 15/642,376

(22) Filed: Jul. 6, 2017

(65) Prior Publication Data

US 2018/0019286 A1  Jan. 18, 2018

(30) Foreign Application Priority Data

Jul. 18, 2016 (KR) .......... 10-2016-0090945

(51) Int. Cl.
| | |
|---|---|
| *H01L 27/32* | (2006.01) |
| *H01L 51/00* | (2006.01) |
| *H01L 51/50* | (2006.01) |
| *H01L 51/52* | (2006.01) |

(52) U.S. Cl.
CPC ........ *H01L 27/3213* (2013.01); *H01L 27/322* (2013.01); *H01L 27/3209* (2013.01); *H01L 51/00* (2013.01); *H01L 51/5036* (2013.01); *H01L 51/5072* (2013.01); *H01L 51/5092* (2013.01); *H01L 51/5271* (2013.01); *H01L 51/5268* (2013.01); *H01L 51/5278* (2013.01)

(58) Field of Classification Search
CPC ............. H01L 27/3209; H01L 27/3213; H01L 27/322; H01L 51/00; H01L 51/5036; H01L 51/5072; H01L 51/5092; H01L 51/5268; H01L 51/5271; H01L 51/5278

See application file for complete search history.

(56) References Cited

U.S. PATENT DOCUMENTS

| | | |
|---|---|---|
| 7,075,231 B1 | 7/2006 | Liao et al. |
| 7,126,267 B2 | 10/2006 | Liao et al. |
| 7,821,201 B2 | 10/2010 | Hatwar et al. |

(Continued)

FOREIGN PATENT DOCUMENTS

| | | |
|---|---|---|
| JP | 4994426 B2 | 5/2012 |
| KR | 10-2015-0028554 A | 3/2015 |
| KR | 10-2015-0125159 A | 11/2015 |

*Primary Examiner* — Dawn L Garrett
(74) *Attorney, Agent, or Firm* — Lewis Roca Rothgerber Christie LLP

(57) ABSTRACT

An organic electroluminescence display device includes a first electrode, a first light emitter on the first electrode, the first light emitter including a first light emitting layer, a first charge generation layer disposed on the first light emitter, a second light emitter on the first charge generation layer, the second light emitter including a second light emitting layer, and a second electrode on the second light emitter. The first light emitter includes a first electron injection enhancing layer on the first light emitting layer. The second light emitter includes an electron injection suppressing layer on the second light emitting layer, the electron injection suppressing layer having electron mobility less than that of the first electron injection enhancing layer.

19 Claims, 13 Drawing Sheets

(56) References Cited

U.S. PATENT DOCUMENTS

| | | | | |
|---|---|---|---|---|
| 7,892,878 B2* | 2/2011 | Lee | ...................... | H01L 51/5092 |
| | | | | 257/E21.053 |
| 8,283,054 B2 | 10/2012 | Spindler et al. | | |
| 2004/0051781 A1* | 3/2004 | Kawaguchi | ............ | C09K 11/06 |
| | | | | 348/34 |
| 2006/0145604 A1* | 7/2006 | Liao | .................... | H01L 51/5052 |
| | | | | 313/506 |
| 2009/0042061 A1* | 2/2009 | Kimura | ................ | C07D 471/04 |
| | | | | 428/704 |
| 2011/0095282 A1* | 4/2011 | Pflumm | ................ | H01L 51/002 |
| | | | | 257/40 |
| 2012/0132898 A1* | 5/2012 | Pan | ........................ | B82Y 10/00 |
| | | | | 257/40 |
| 2012/0232241 A1* | 9/2012 | Stoessel | ............... | C07D 455/03 |
| | | | | 528/228 |
| 2013/0207088 A1* | 8/2013 | Seo | .................... | H01L 51/5016 |
| | | | | 257/40 |
| 2014/0163233 A1* | 6/2014 | Balaganesan | ....... | H01L 51/0055 |
| | | | | 546/256 |
| 2014/0332790 A1* | 11/2014 | Fadhel | ................ | H01L 51/0072 |
| | | | | 257/40 |
| 2015/0069357 A1* | 3/2015 | Park | ...................... | H01L 51/508 |
| | | | | 257/40 |
| 2015/0188074 A1* | 7/2015 | Heo | .................... | H01L 51/5044 |
| | | | | 257/40 |

* cited by examiner

ORGANIC ELECTROLUMINESCENCE DISPLAY DEVICE

CROSS-REFERENCE TO RELATED APPLICATION

Korean Patent Application No. 10-2016-0090945, filed on Jul. 18, 2016, in the Korean Intellectual Property Office, and entitled: "Organic Electroluminescence Display Device," is incorporated by reference herein in its entirety.

BACKGROUND

1. Field

Embodiments relate to an organic electroluminescence display device.

2. Description of the Related Art

Flat display devices may be classified into light-emitting type display devices and light-receiving type display devices. The light-emitting type display devices include flat cathode ray tubes (FCRTs), plasma display panels (PDPs), and organic light emitting displays (OLEDs). Such an OLED is an emissive display device and has a wide viewing angle, excellent contrast, and a fast response speed.

Accordingly, when the OLED is applied to displays for a mobile device such as a digital camera, a video camera, a portable information terminal, a smart phone, an ultra slim notebook computer, a tablet personal computer, and a flexible display device or large scale electrical/electronic products such as an ultra thin television, it receives much attention.

The OLED may realize colors by using a principle in which holes and electrons, which are respectively injected into first and second electrodes, are recombined with each other to emit light. That is, when excitons in which the injected holes and electrons are combined with each other return from an excited state to a ground state, light may be emitted.

The OLEDs are being developed in various structures. Among the structures, a tandem structure in which each of layers between a first electrode and a second electrode are deposited without using a mask becoming more popular.

SUMMARY

Embodiments are directed to an organic electroluminescence display device including a first electrode, a first light emitter on the first electrode, the first light emitter including a first light emitting layer, a first charge generation layer disposed on the first light emitter, a second light emitter on the first charge generation layer, the second light emitter including a second light emitting layer, and a second electrode on the second light emitter. The first light emitter includes a first electron injection enhancing layer on the first light emitting layer. The second light emitter includes an electron injection suppressing layer on the second light emitting layer, the electron injection suppressing layer having electron mobility less than that of the first electron injection enhancing layer.

Each of the first electron injection enhancing layer and the electron injection suppressing layer may include Liq, LiF, $Li_2O$, CsF, BaF, BaO, $Al_2O_3$, NaCl, RbCl, or RbI, and an electron transport material. A ratio of the Liq, LiF, $Li_2O$, CsF, BaF, BaO, $Al_2O_3$, NaCl, RbCl, or RbI to the electron transport material in the first electron injection enhancing layer may be about 5:5 to about 7:3. A ratio of the Liq, LiF, $Li_2O$, CsF, BaF, BaO, $Al_2O_3$, NaCl, RbCl, or RbI to the electron transport material in the electron injection suppressing layer is about 4:6 to about 2:8.

The electron transport material may include an N-containing heterocyclic compound.

A number of ring formation nitrogen atoms of the N-containing heterocyclic compound contained in the electron injection suppressing layer may be less than a number of ring formation nitrogen atoms of the N-containing heterocyclic compound contained in the first electron injection enhancing layer.

The N-containing heterocyclic compound contained in the electron injection suppressing layer may include one ring formation nitrogen atom. The N-containing heterocyclic compound contained in the first electron injection enhancing layer may include three ring formation nitrogen atoms.

Each of the first electron injection enhancing layer and the electron injection suppressing layer may include Liq and the electron transport material.

The organic electroluminescence display device may further include a second charge generation layer between the first charge generation layer and the second light emitter, and a third light emitter between the first charge generation layer and the second charge generation layer and comprising a third light emitting layer. The third light emitter may be on the third light emitting layer and may include a second electron injection enhancing layer having electron mobility greater than that of the electron injection suppressing layer.

The second electron injection enhancing layer may include Liq, LiF, $Li_2O$, CsF, BaF, BaO, $Al_2O_3$, NaCl, RbCl, or RbI, and an electron transport material. A ratio of the Liq, LiF, $Li_2O$, CsF, BaF, BaO, $Al_2O_3$, NaCl, RbCl, or RbI to the electron transport material of the second electron injection enhancing layer may be about 5:5 to about 7:3.

The electron transport material may include an N-containing heterocyclic compound including three ring formation nitrogen atoms.

Two light emitting layers of the first, second, and third light emitting layers may include blue light emitting layers that emit blue light. A remaining one of the first, second, and third light emitting layers may include a light emitting layer that emits white light by being mixed with the blue light.

The second light emitting layer and the third light emitting layer may include the blue light emitting layers that emit the blue light. The first light emitting layer may include the light emitting layer that emits the white light by being mixed with the blue light.

Two light emitting layers of the first, second, and third light emitting layers may include blue light emitting layers that emit blue light, and a remaining one of the first, second, and third light emitting layers may include a yellow light emitting layer that emits yellow light.

Two light emitting layers of the first, second, and third light emitting layers may include blue light emitting layers that emit blue light, and a remaining one of first, second, and third light emitting layers includes a first sub light emitting layer and a second sub light emitting layer. One of the first and second sub light emitting layers may include a red light emitting layer that emits red light, and another one of the first and second sub light emitting layers may include a green light emitting layer that emits green light.

The organic electroluminescence display device may further include a color filter spaced apart from the second electrode.

Each of the first, second, and third light emitting layers may include a blue light emitting layer that emits blue light.

The first light emitting layer may emit a first blue light having a first wavelength band. The second light emitting layer may emit a second blue light having a second wavelength band. The third light emitting layer may emit a third blue light having a third wavelength band.

Peak wavelengths of the first, second, and third wavelength bands may be different from each other.

The organic electroluminescence display device may include a color conversion layer spaced apart from the second electrode.

The color conversion layer may include a resin layer and a color conversion material contained in the resin layer. The color conversion material may include at least one of an inorganic phosphor, an organic phosphor, a quantum dot, and an organic dye.

The first electrode may include a reflective electrode or a transflective electrode. The second electrode may include a transmissive electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
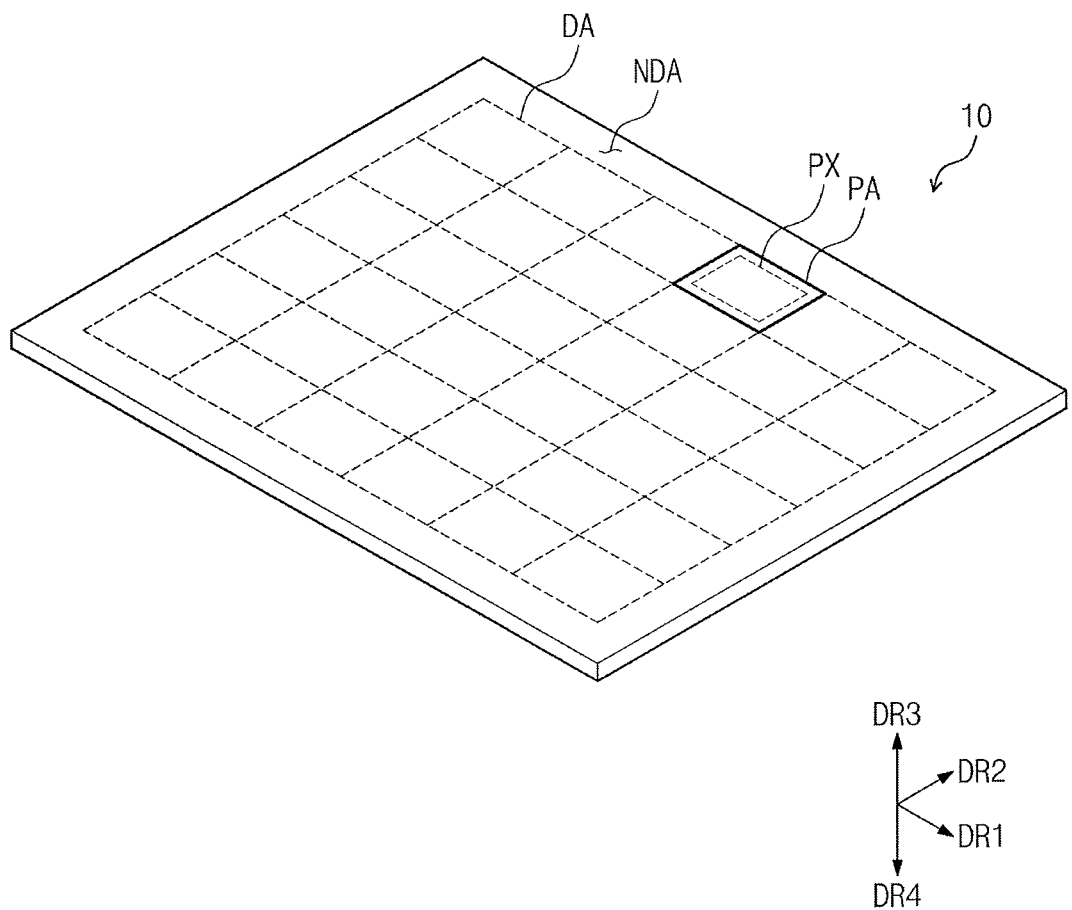
FIG. 1 illustrates a schematic perspective view of an organic electroluminescence display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

Hereinafter, an organic electroluminescence display device according to an embodiment will be described.

FIG. 1 illustrates a schematic perspective view of an organic electroluminescence display device according to an embodiment.

Referring to FIG. 1, an organic electroluminescence display device 10 according to an embodiment may include a display area DA and a non-display area NDA. An image may be displayed on the display area DA. When viewed in a thickness direction (e.g., a direction DR4) of the organic electroluminescence display device 10, the display area DA may have, for example, an approximately rectangular shape.

The display area DA may include a plurality of pixel areas PA. The plurality of pixel areas PA may be arrayed in a matrix form. A plurality of pixels PX may be disposed on the plurality of pixel areas PA. Each of the pixels PX may include an organic electroluminescence element (see reference symbol OEL of FIG. 2). Each of the pixels PX may include a plurality of sub pixels SPX. The sub pixels SPX will be described below.

An image is not displayed on the non-display area NDA. When viewed in the thickness direction DR4 of the organic electroluminescence display device 10, the non-display area NDA may, for example, surround the display area DA. The non-display area NDA may be adjacent to the display area DA in a first direction DR1 and a second direction DR2. The second direction DR2 crosses each of the first and third direction DR1 and DR3.

Figure 2:
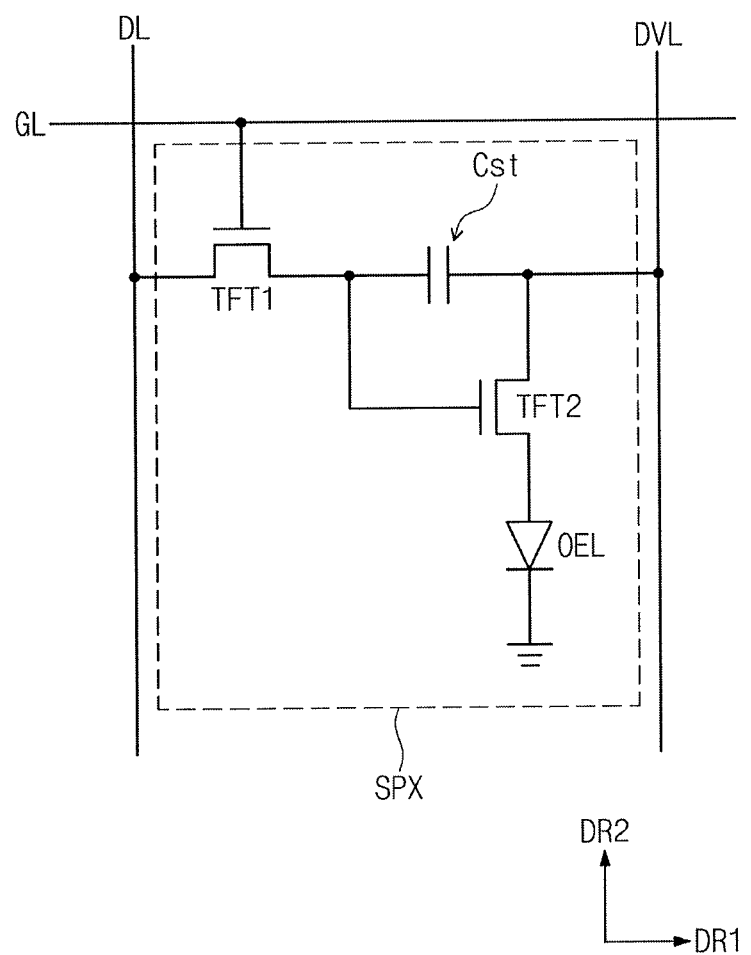
FIG. 2 illustrates a circuit view of one of sub pixels provided in the organic electroluminescence display device according to an embodiment.
Figure 3:
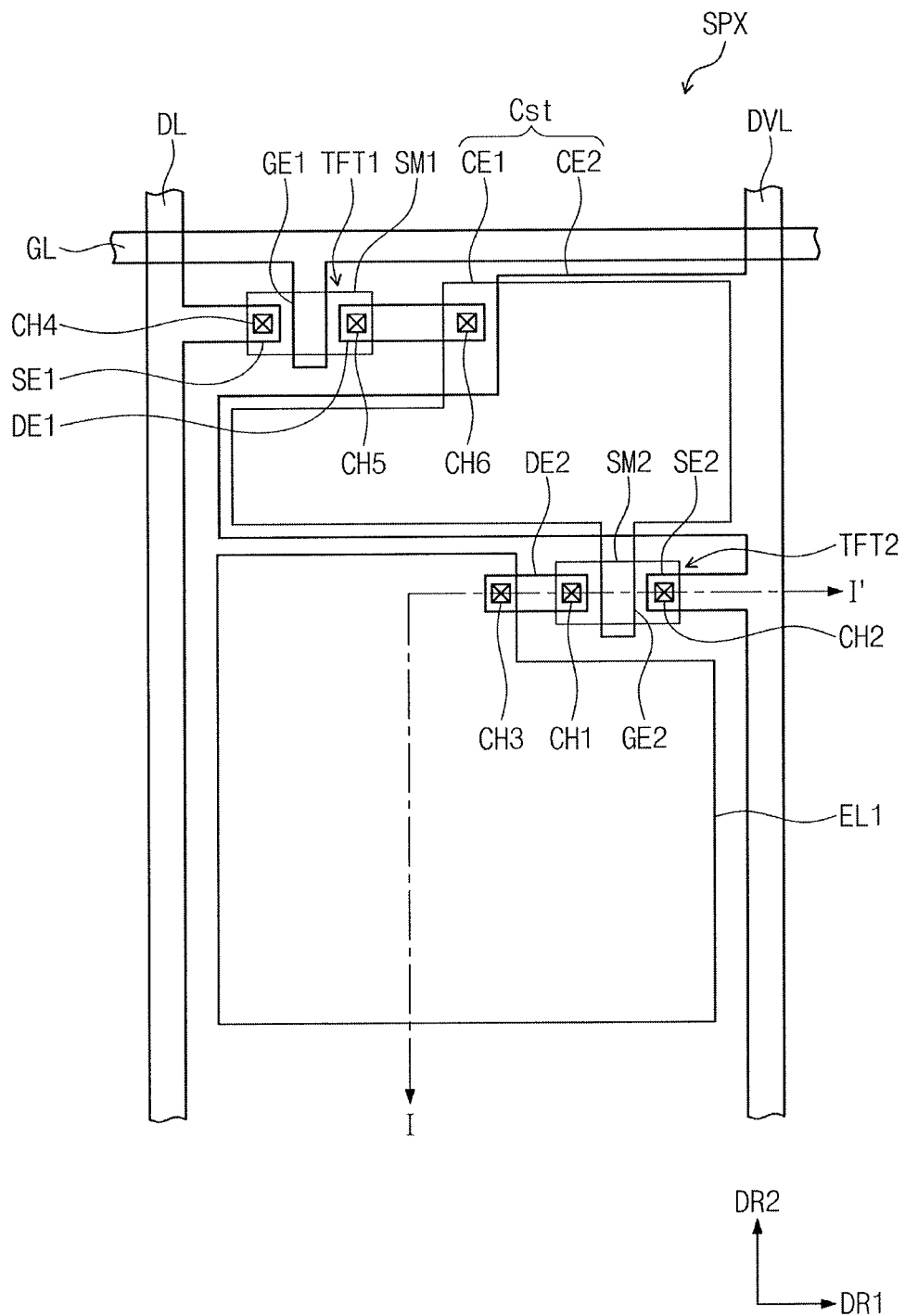
FIG. 3 illustrates a plan view of one of the sub pixels provided in the organic electroluminescence display device according to an embodiment.
Figure 4:
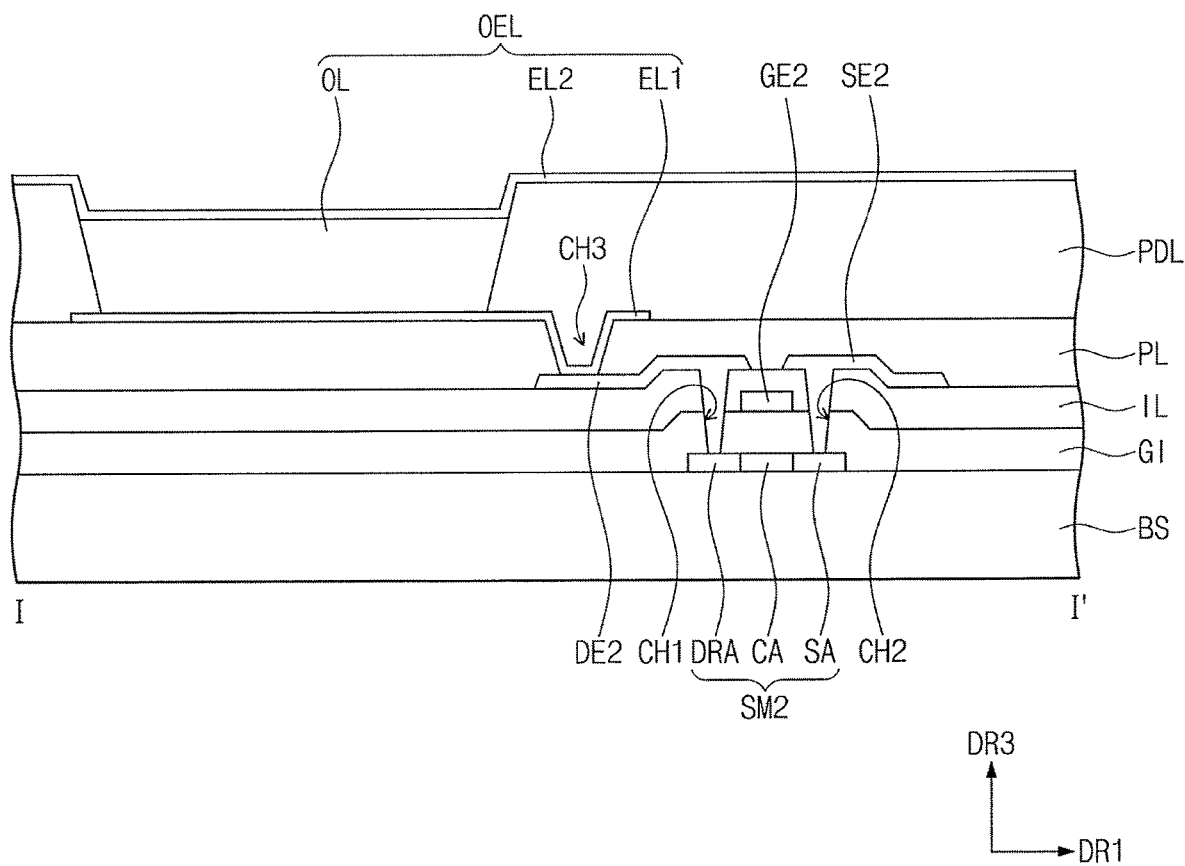
FIG. 4 illustrates a schematic cross-sectional view taken along line I-I' of FIG. 3.

FIG. 2 illustrates a circuit view of one of the sub pixels provided in the organic electroluminescence display device according to an embodiment. FIG. 3 illustrates a plan view of one of the sub pixels provided in the organic electroluminescence display device according to an embodiment. FIG. 4 illustrates a schematic cross-sectional view taken along line I-I' of FIG. 3.

Referring to FIGS. 2 to 4, each of the sub pixels SPX may be connected to a line part constituted by a gate line GL, a data line DL, and a driving voltage line DVL. Each of the sub pixels SPX may include thin film transistors TFT1 and TFT2 connected to the line part, the organic electroluminescence element (OEL) connected to the thin film transistors TFT1 and TFT2, and a capacitor Cst. The organic electroluminescence element OEL will be described below in detail.

The gate line GL may extend in the first direction DR1. The data line DL may extend in the second direction DR2 that crosses the gate line GL. The driving voltage line DVL may extend in the substantially same direction as the data line DL, for example in the second direction DR2. The gate line GL may transmit a scanning signal to the thin film transistors TFT1 and TFT2. The data line DL may transmit a data signal to the thin film transistors TFT1 and TFT2. The driving voltage line DVL may provide a driving voltage to the thin film transistors TFT1 and TFT2.

The thin film transistors TFT1 and TFT2 may include a driving thin film transistor TFT2 to control the organic electroluminescence element OEL and a switching thin film transistor TFT1 to switch the driving thin film transistor TFT2. In an implementation, each of the sub pixels SPX may include the two thin film transistors TFT1 and TFT2. In some implementations, each of the sub pixels SPX may include one thin film transistor and capacitor or include at least three thin film transistors and at least two capacitors.

The switching thin film transistor TFT1 may include a first gate electrode GE1, a first source electrode SE1, and a first drain electrode DE1. The first gate electrode GE1 may be connected to the gate line GL, and the first source electrode SE1 may be connected to the data line DL. The first drain electrode DE1 may be connected to a first common electrode CE1 by a fifth contact hole CH5. The switching thin film transistor TFT1 may transmit the data signal applied to the data line DL to the driving thin film transistor TFT2 according to the scanning signal applied to the gate line GL.

The driving thin film transistor TFT2 may include a second gate electrode GE2, a second source electrode SE2, and a second drain electrode DE2. The second gate electrode GE2 may be connected to the first common electrode CE1. The second source electrode SE2 may be connected to the driving voltage line DVL. The second drain electrode DE2 may be connected to the first electrode EL1 by a third contact hole CH3.

The capacitor Cst may be connected between the second gate electrode GE2 and the second source electrode SE2 of the driving thin film transistor TFT2 to charge and maintain the data signal inputted to the second gate electrode GE2 of the driving thin film transistor TFT2. The capacitor Cst may include the first common electrode CE1 connected to the first drain electrode DE1 by a sixth contact hole CH6 and a second common electrode CE2 connected to the driving voltage line DVL.

The organic electroluminescence display device 10 according to an embodiment may include a base substrate BS on which the thin film transistors TFT1 and TFT2 and the organic electroluminescence element OEL are laminated. The base substrate BS may be a suitable material for forming the base substrate BS. For example, the base substrate BS may be made of an insulating material such as glass, plastic, or crystal. An organic polymer for forming the base substrate BS may include polyethylene terephthalate (PET), polyethylene naphthalate (PEN), polyimide, or polyether sulfone. The base substrate BS may be suitably selected in consideration of mechanical strength, thermal stability, transparency, surface roughness, tractability, waterproofing property, or the like.

A substrate buffer layer may be disposed on the base substrate BS. The substrate buffer layer may prevent impurities from being diffused into the switching thin film transistor TFT1 and the driving thin film transistor TFT2. The substrate buffer layer may be made of SiNx, SiOx, or SiOxNy. The substrate buffer layer may be omitted according to the material and process conditions of the base substrate BS.

A first semiconductor layer SM1 and a second semiconductor layer SM2 may be disposed on the base substrate BS. Each of the first and second semiconductor layers SM1 and SM2 may be made of a semiconductor material. The first and second semiconductor layers SM1 and SM2 may function as active layers of the switching and driving thin film transistors TFT1 and TFT2, respectively. Each of the first and second semiconductor layers SM1 and SM2 may include a source area SA, a drain area DRA, and a channel area CA disposed between the source area SA and the drain area DRA. Each of the first and second semiconductor layers SM1 and SM2 may be made of an inorganic semiconductor material or an organic semiconductor material. The source area SA and the drain area DRA may be doped with n-type impurities or p-type impurities.

A gate insulation layer GI may be disposed on the first and second semiconductor layers SM1 and SM2. The gate insulation layer GI may cover the first and second semiconductor layers SM1 and SM2. The gate insulation layer GI may be formed of an organic insulation material or an inorganic insulation material.

The first and second gate electrodes GE1 and GE2 may be disposed on the gate insulation layer GI. Each of the first and second gate electrodes GE1 and GE2 may cover an area corresponding to the channel area CA of each of the first and second semiconductor layers SM1 and SM2.

An interlayer insulation layer IL may be disposed on the first and second gate electrodes GE1 and GE2. The interlayer dielectric IL may cover the first and second gate electrodes GE1 and GE2. The interlayer dielectric IL may be made of an organic insulating material or inorganic insulating material.

The first source and drain electrodes SE1 and DE1 and the second source and drain electrodes SE2 and DE2 may be disposed on the interlayer dielectric IL. The second drain electrode DE2 may contact the drain area DRA of the second semiconductor layer SM2 by way of a first contact hole CH1 defined in the gate insulation layer GI and the interlayer dielectric IL. The second source electrode SE2 may contact the source area SA of the second semiconductor layer SM2 by way of a second contact hole CH2 defined in the gate insulation layer GI and the interlayer dielectric IL. The first source electrode SE1 may contact a source area of the first semiconductor layer SM1 by way of a fourth contact hole CH4 defined in the gate insulation layer GI and the interlayer dielectric IL, and the first drain electrode DE1 may contact a drain area of the first semiconductor layer SM1 by way of a fifth contact hole CH5 defined in the gate insulation layer GI and the interlayer dielectric IL.

A passivation layer PL may be disposed on the first source and drain electrodes SE1 and DE1 and the second source and drain electrodes SE2 and DE2. The passivation layer PL may function as a protection layer to protect the switching thin film transistor TFT1 and the driving thin film transistor TFT 2 and also 10 function as a planarization layer to planarize top surfaces of the switching thin film transistor TFT1 and the driving thin film transistor TFT 2.

The organic electroluminescence element OEL may be disposed on the passivation layer PL. The organic electroluminescence element OEL may include a first electrode EL1, a second electrode EL2 disposed on the first electrode EL1, and an organic layer OL including at least 1-layered organic layers disposed between the first electrode EL1 and the second electrode EL2.

The first electrode EL1 may be disposed on the passivation layer PL, and a pixel defining layer PDL may be disposed on the passivation layer PL and the first electrode EL1. The pixel defining layer PDL may expose a portion of a top surface of the first electrode EL1. The pixel defining layer PDL may include, for example, a metal-fluorine ion compound. The pixel defining layer PDL may be made of, for example, a metal-fluorine ion compound of LiF, $BaF_2$, and CsF. If the metal-fluorine ion compound may have a predetermined thickness. The metal-fluorine ion compound may have an insulating property.

The organic layer OL and the second electrode EL2 may be successively laminated on the pixel defining layer PDL and the first electrode EL1.

The first electrode EL1 may be, for example, a positive electrode. The first electrode EL1 may be connected to the second drain electrode DE2 of the driving thin film transistor TFT2 through the third contact hole CH3 defined in the passivation layer PL.

Figure 5:
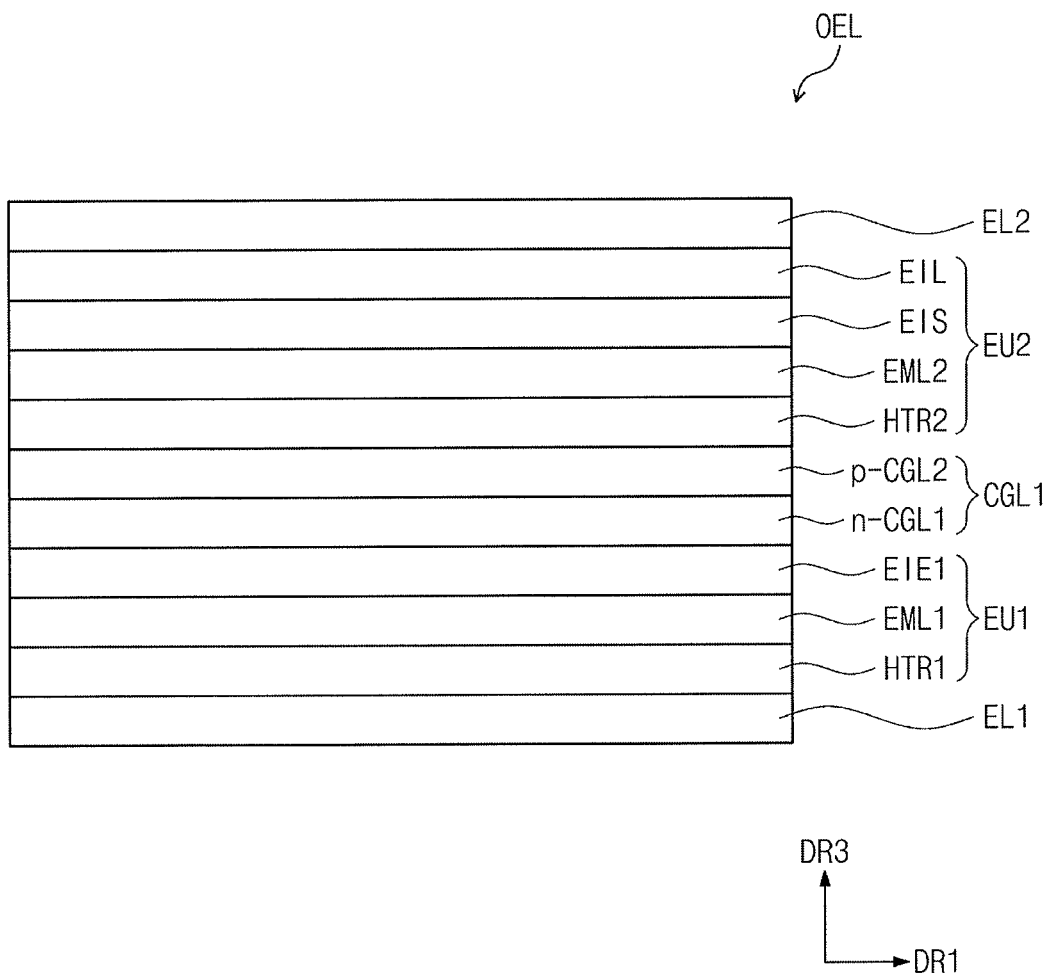
FIG. 5 illustrates a schematic cross-sectional view of an organic electroluminescence element provided in the organic electroluminescence display device according to an embodiment.

FIG. 5 illustrates a schematic cross-sectional view of an organic electroluminescence element provided in the organic electroluminescence display device according to an embodiment.

FIG. 5 illustrates a schematic cross-sectional view of the organic electroluminescence element OEL.

As described above, the organic electroluminescence element OEL provided in the organic electroluminescence display device 10 according to an embodiment may include an organic layer (see reference symbol OL of FIG. 4) including at least 1-layered organic layers between the first and second electrodes EL1 and EL2, which face each other. For example, the organic electroluminescence element OEL may include first light emitter EU1 and second light emitter EU2 between the first and second electrodes EL1 and EL2, which face each other. A first charge generation layer CGL1 may be disposed between the first and second light emitters EU1 and EU2.

The first light emitter EU1, the first charge generation layer CGL1, and the second light emitter EU2 may be successively disposed in the third direction DR3 from the first electrode EL1 to the second electrode EL2.

The first electrode EL1 may have conductivity. The first electrode EL1 may be a pixel electrode or positive electrode. The first electrode EL1 may be a transmissive electrode, a transflective electrode, or a reflective electrode. When the first electrode EL1 is the transmissive electrode, the first electrode EL1 may include a transparent metal oxide, for example, indium tin oxide (ITO), indium zinc oxide (IZO), zinc oxide (ZnO), or indium tin zinc oxide (ITZO). When the first electrode EL1 is the transflective or reflective electrode, the first electrode EL1 may include Ag, Mg, Al, Pt, Pd, Au, Ni, Nd, Ir, Cr, or a metal mixture.

The second electrode EL2 may be a common electrode or a negative electrode. The second electrode EL2 may be a transmissive electrode, a transflective electrode, or a reflective electrode.

When the second electrode EL2 is the transmissive electrode, the second electrode EL2 may include Li, Ca, LiF/Ca, LiF/Al, Al, Mg, BaF, Ag or a compound or mixture (e.g., a mixture of Ag and Mg) thereof. In some implementations, the second electrode EL2 may include indium tin oxide (ITO), indium zinc oxide (IZO), or indium tin zinc oxide (ITZO).

The second electrode EL may be connected to an auxiliary electrode. A suitable material for forming the auxiliary electrode may be used. For example, the auxiliary electrode may include Li, Ca, LiF/Ca, LiF/Al, Al, Mg, BaF, Ag or a compound or mixture (e.g., a mixture of Ag and Mg) thereof. The auxiliary electrode may include, for example, indium tin oxide (ITO), indium zinc oxide (IZO), or indium tin zinc oxide (ITZO). The auxiliary electrode may be connected to the second electrode EL2, for example, to reduce a resistance value of the second electrode EL2.

When the second electrode EL2 is the transflective electrode or the reflective electrode, the second electrode EL2 may include Ag, Mg, Al, Pt, Pd, Au, Ni, Nd, Ir, Cr, Li, Ca, LiF/Ca, LiF/Al, Mo, Ti, or a compound or mixture (e.g., a mixture of Ag and Mg) thereof. In some implementations, the second electrode EL2 may have a multi-layered structure including a reflective layer or a transflective layer and a transparent conductive layer formed of indium tin oxide (ITO), indium zinc oxide (IZO), zinc oxide (ZnO), or indium tin zinc oxide (ITZO).

The first electrode EL1 may be a reflective electrode or a transflective electrode, and the second electrode EL2 may be a transmissive electrode. For example, the organic electroluminescence display device 10 according to an embodiment may include a front emitting-type organic electroluminescence element OEL.

The first electrode EL1 may include, for example a first layer including Ag and a second layer disposed on the first layer and including ITO. The second electrode EL2 may have, for example, a single-layer structure including a mixture of Ag and Mg. The first layer including Ag may reflect light.

The second light emitter EU2 is disposed most adjacent to the second electrode EL2 and directly receives electrons from the second electrode EL2. According more electrons may be injected into the second light emitter EU2 than are injected into the first light emitter EU1, which is spaced apart from the second electrode EL2. Although the first light emitter EU1 receives electrons from the first charge generation layer CGL1, the first charge generation layer CGL1 nevertheless receives fewer electrons when compared to the second electrode EL2.

The organic electroluminescence element OEL provided in the organic electroluminescence display device 10 according to an embodiment may provide an electron injection enhancing layer or an electron injection suppressing layer according to positions of the light emitters EU1 and EU2.

For example, the first light emitter EU1 may include a first light emitting layer EML1, and the second light emitter EU2 may include a second light emitting layer EML2. A first electron injection enhancing layer EIE1 may be disposed on the first light emitting layer EML1, and the electron injection suppressing layer EIS may be disposed on the second light emitting layer EML2. The electron injection suppressing layer EIS may have a function of injecting fewer electrons into the second light emitting layer EML2 than are injected into the first light emitting layer EML1 according to an electron injection function of the first electron injection enhancing layer EIE1. For example, the electron injection suppressing layer EIS may have less electron mobility than the first electron injection enhancing layer EIE1.

For example, the electron injection suppressing layer EIS that suppresses the injection of the electrons may be disposed on the second light emitter EU2 disposed most adjacent to the second electrode EL2, and the first electron injection enhancing layer EIE1 that enhances the injection of the electrons may be disposed on the first light emitter EU1, which is spaced apart from the second electrode EL2.

Thus, there may be an effect in which emission lifespans between the light emitters EU1 and EU2 are balanced by matching electron amounts injected into the light emitters EU1 and EU2. As a result, when the light emitters EU1 and EU2 emit light having wavelength bands different from each other, a color lifespan may be improved. The term "color lifespan" refers to a lifespan balance between the different colors of light emitted from the organic electroluminescence element OEL. Also, there may be an effect in which the organic electroluminescence element OEL is improved in efficiency and emission lifespan.

Each of the first electron injection enhancing layer EIE1 and the electron injection suppressing layer EIS may include Liq, LiF, Li$_2$O, CsF, BaF, BaO, Al$_2$O$_3$, NaCl, RbCl, and RbI, or an electron transport material.

Each of the first electron injection enhancing layer EIE1 and the electron injection suppressing layer EIS may include Liq (e.g., lithium quinolate) and an electron transport material. In some implementations, at least one of the first electron injection enhancing layer EIE1 and the electron injection suppressing layer EIS may include LiF and an electron transport material.

The Liq, LiF, Li$_2$O, CsF, BaF, BaO, Al$_2$O$_3$, NaCl, RbCl, or RbI, and the electron transport material that are provided in the first electron injection enhancing layer EIE1 may be contained at a ratio of the Liq, LiF, Li$_2$O, CsF, BaF, BaO, Al$_2$O$_3$, NaCl, RbCl, or RbI to the electron transport material in a range of 5:5 to 7:3. For example, the Liq, LiF, Li$_2$O, CsF, BaF, BaO, Al$_2$O$_3$, NaCl, RbCl, or RbI that is provided in the first electron injection enhancing layer EIE1 may be contained in an amount of about 30% to about 50% based the total of the Liq, LiF, Li$_2$O, CsF, BaF, BaO, Al$_2$O$_3$, NaCl, RbCl, or RbI and the electron transport material. When the Liq, LiF, Li$_2$O, CsF, BaF, BaO, Al$_2$O$_3$, NaCl, RbCl, or RbI is contained in an amount of about 30% or more, the electron injection enhancing effect may be sufficient. When t Liq, LiF, Li$_2$O, CsF, BaF, BaO, Al$_2$O$_3$, NaCl, RbCl, or RbI is contained in an amount of about 50% or more, an increase rate of the electron injection enhancing effect may be sufficient. Furthermore, when the predetermined ratio is not exceeded, the suppression of electron injection may be avoided. When the Liq, LiF, Li$_2$O, CsF, BaF, BaO, Al$_2$O$_3$, NaCl, RbCl, or RbI includes Liq, the effect may be maximized.

The Liq, LiF, Li$_2$O, CsF, BaF, BaO, Al$_2$O$_3$, NaCl, RbCl, or RbI and the electron transport material that are provided in the electron injection suppressing layer EIS may be contained at a ratio of Liq, LiF, Li$_2$O, CsF, BaF, BaO, Al$_2$O$_3$, NaCl, RbCl, and RbI to the electron transport material in a range of 4:6 to 2:8. For example, the Liq, LiF, Li$_2$O, CsF, BaF, BaO, Al$_2$O$_3$, NaCl, RbCl, or RbI that is provided in the electron injection suppressing layer EIS may be contained in an amount of about 60% to about 80% based the total of the Liq, LiF, Li$_2$O, CsF, BaF, BaO, Al$_2$O$_3$, NaCl, RbCl, and RbI and the electron transport material. For example, the Liq, LiF, Li$_2$O, CsF, BaF, BaO, Al$_2$O$_3$, NaCl, RbCl, or RbI may be contained in an amount of about 60% to about 75%, or, for example, about 60% to about 70%. When Liq, LiF, Li$_2$O, CsF, BaF, BaO, Al$_2$O$_3$, NaCl, RbCl, or RbI is contained at a ratio of about 60% or more, the electron injection suppressing effect may be sufficient. Furthermore, when the Liq, LiF, Li$_2$O, CsF, BaF, BaO, Al$_2$O$_3$, NaCl, RbCl, or RbI is contained in an amount more than the described ratio, an enhanced electron injection may be avoided. When the Liq, LiF, Li$_2$O, CsF, BaF, BaO, Al$_2$O$_3$, NaCl, RbCl, or RbI is contained in an amount less than about 80%, excessive suppression of the electron injection and excessive reduction of an amount of electrons injected into the second light emitter EU2 may be avoided. When the Liq, LiF, Li$_2$O, CsF, BaF, BaO, Al$_2$O$_3$, NaCl, RbCl, or RbI includes Liq, the effect may be maximized.

The ratio of the Liq, LiF, Li$_2$O, CsF, BaF, BaO, Al$_2$O$_3$, NaCl, RbCl, or RbI to the electron transport material may be a volume ratio.

The electron transport material contained in each of the first electron injection enhancing layer EIE1 and the electron injection suppressing layer EIS may include an N-containing heterocyclic compound. The electron transport material contained in each of the first electron injection enhancing layer EIE1 and the electron injection suppressing layer EIS may be the same or different from each other. The N-containing heterocyclic compound may further include hetero atoms in addition to nitrogen. For example, the N-containing heterocyclic compound may be a cyclic compound including nitrogen and oxygen as hetero atoms.

The N-containing heterocyclic compound that is used as the electron transport material may be a suitable electron transporting N-containing heterocyclic compound. For example, the N-containing heterocyclic compound may include a pyridine derivative, a pyrimidine derivative, a pyrazine derivative, a triazine derivative, a triazole derivative, a pyridazine derivative, an oxadiazole derivative, a benzimidazole derivative, a phenanthroline derivative, or a combination thereof.

The N-containing heterocyclic compound may include, for example, at least one kind of compound of the following compounds.

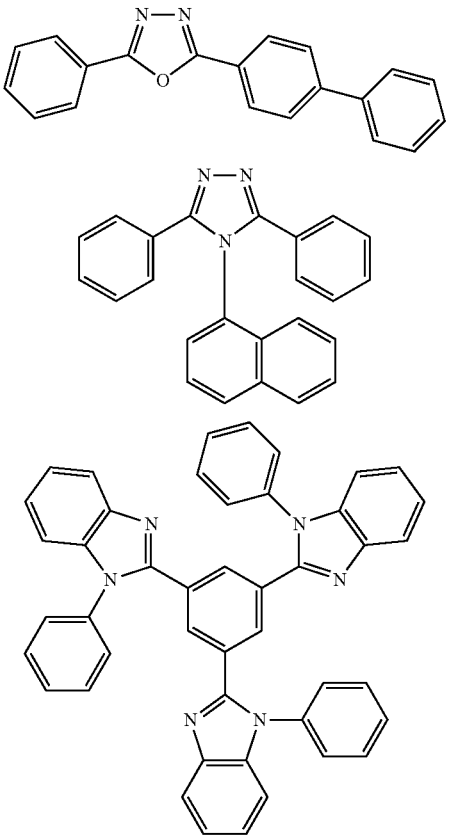

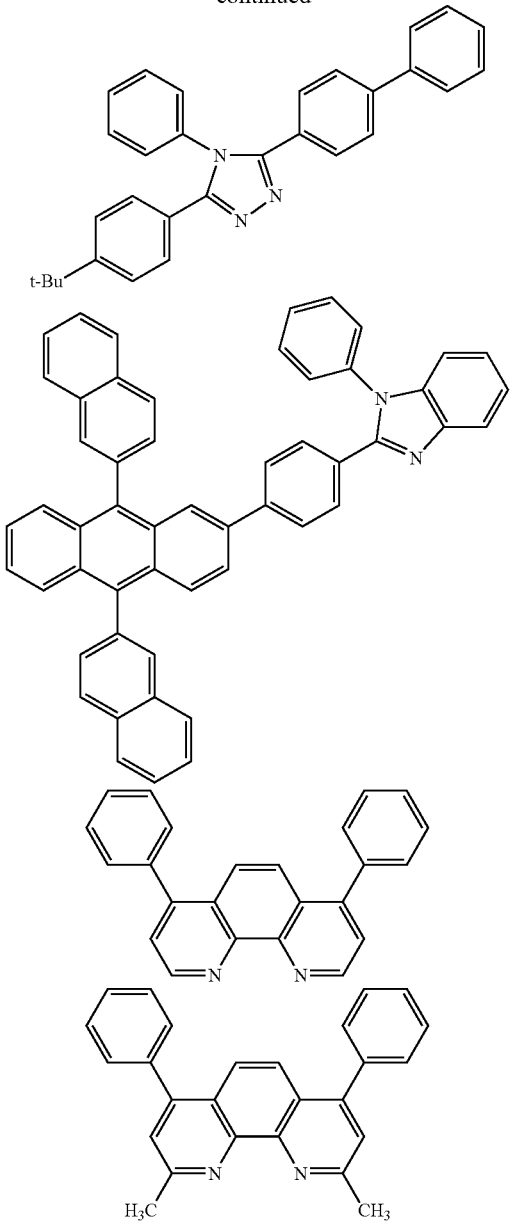

For example, Li of Liq may form a coordinate bond with an unshared electron pair of nitrogen contained in the N-containing heterocyclic compound and thus enhance the electron injection. However, when the amount of Liq is above about 60%, its own low electron mobility characteristics of Liq may serve to suppress the electron injection. Thus, a ratio of the N-containing heterocyclic compound to Liq may be adjusted to control the electron injection suppression or enhancement.

The number of ring formation nitrogen atoms of the N-containing heterocyclic compound contained in the electron injection suppressing layer EIS may be less than the number of ring formation nitrogen atoms of the N-containing heterocyclic compound contained in the first electron injection enhancing layer EIE1. The N-containing heterocyclic compound contained in the first electron injection enhancing layer EIE1 may contain more nitrogen than the N-containing heterocyclic compound contained in the electron injection suppressing layer EIS. Thus, the possibility of the coordinate bond between Li of Liq and the unshared electron pair may increase to efficiently realize the effect of enhancing the electron injection.

For example, the N-containing heterocyclic compound contained in the electron injection suppressing layer EIS may include one ring formation nitrogen atom, and the N-containing heterocyclic compound contained in the first electron injection enhancing layer EIE1 may include three ring formation nitrogen atoms.

The term "number of ring formation nitrogen atoms" represents the number of nitrogen of atoms for forming the ring.

Figure 6:
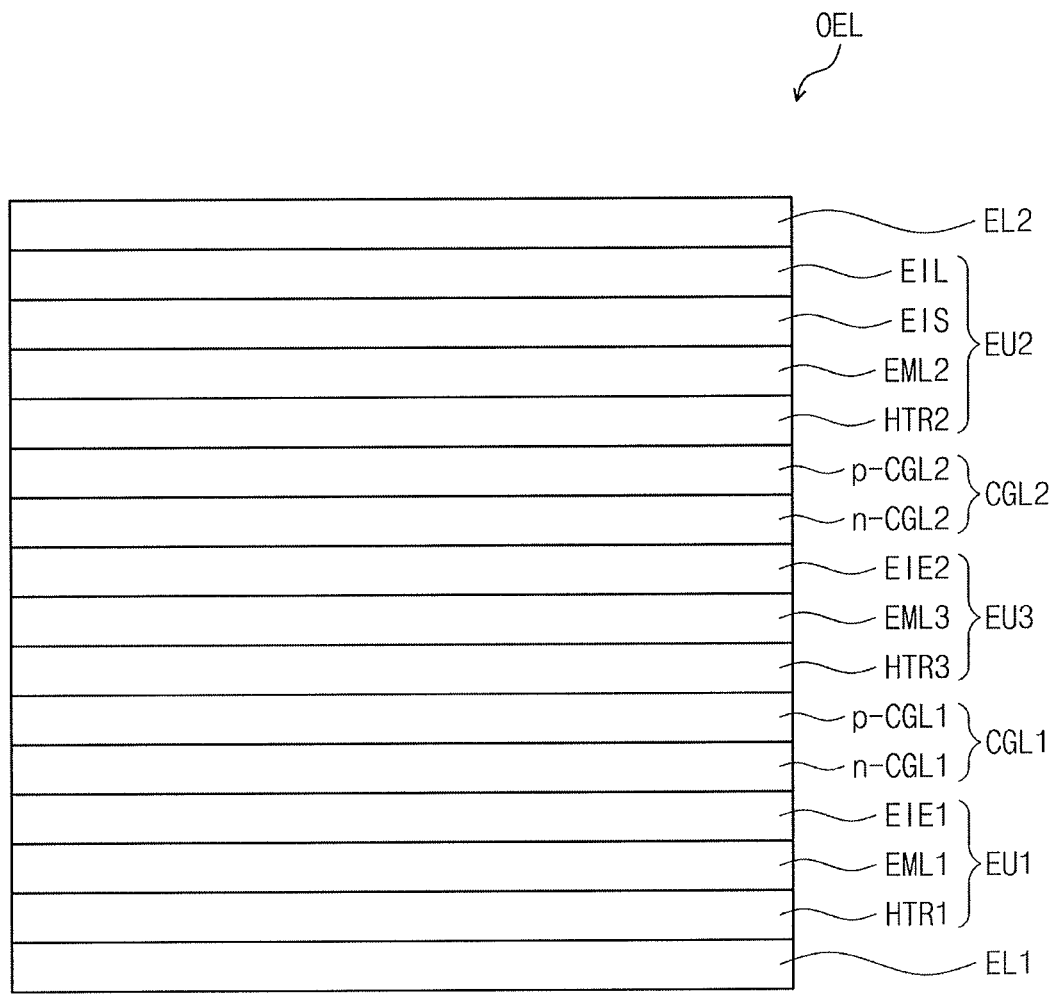
FIG. 6 illustrates a schematic cross-sectional view of an organic electroluminescence element provided in the organic electroluminescence display device according to an embodiment.
Figure 7:
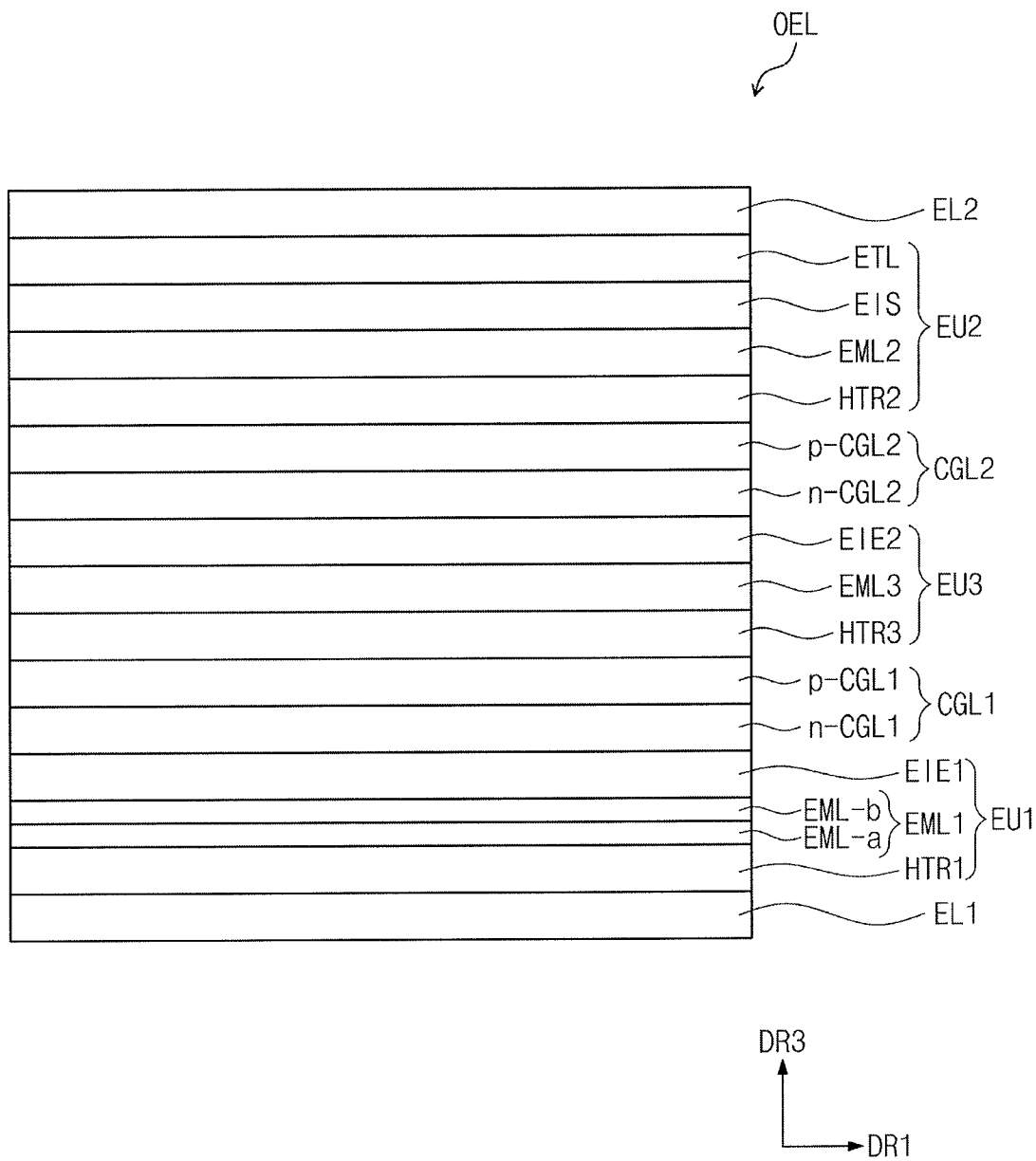
FIG. 7 illustrates a schematic cross-sectional view of an organic electroluminescence element provided in the organic electroluminescence display device according to an embodiment.

FIG. 6 illustrates a schematic cross-sectional view of the organic electroluminescence element provided in the organic electroluminescence display device according to an embodiment. FIG. 7 illustrates a schematic cross-sectional view of the organic electroluminescence element provided in the organic electroluminescence display device according to an embodiment.

Referring to FIGS. 6 and 7, the organic electroluminescence element OEL provided in the organic electroluminescence display device 10 according to an embodiment may further include a second charge generation layer CGL2 and a third light emitter EU3. Particularly, the organic electroluminescence element OEL may further include the second charge generation layer CGL2 disposed between the first charge generation layer CGL1 and the second light emitter EU2 and the third light emitter EU3 disposed between the first charge generation layer CGL1 and the second charge generation layer CGL2 and including a third light emitting layer EML3.

The third light emitter EU3 may include a second electron injection enhancing layer EIE2 disposed on the third light emitting layer EML3 and having electron mobility greater than that of the electron injection suppressing layer EIS. For example, the electron injection suppressing layer EIS may have electron mobility that is less than that of the first electron injection enhancing layer EIE1 and less than that of the second electron injection enhancing layer EIE2.

The second electron injection enhancing layer EIE2 may enhance the electron injection to the third light emitter EU3 to compensate for the distance of the third light emitter EU3 from the second electrode EL2.

The second electron injection enhancing layer EIE2 may include Liq, LiF, $Li_2O$, CsF, BaF, BaO, $Al_2O_3$, NaCl, RbCl, or RbI and an electron transport material. For example, the second electron injection enhancing layer may include Liq and an electron transport material.

The Liq, LiF, $Li_2O$, CsF, BaF, BaO, $Al_2O_3$, NaCl, RbCl, or RbI and the electron transporting material that are provided in the second electron injection enhancing layer EIE2 may be contained at a ratio of the Liq, LiF, $Li_2O$, CsF, BaF, BaO, $Al_2O_3$, NaCl, RbCl, or RbI to the electron transport material in a range of 5:5 to 7:3. An effect due to the above-described ratio may be the same as the description in the above-described first electron injection enhancing layer EIE1. Accordingly, a description thereof will not be repeated.

The descriptions with respect to the electron transport material contained in the second electron injection enhancing layer EIE2 may be the same as those with respect to the electron transport material contained in the above-described first electron injection enhancing layer EIE1. For example, the electron transport material contained in the second electron injection enhancing layer EIE2 may be an N-containing heterocyclic compound and the number of ring formation nitrogen atoms may be greater than the number of ring formation nitrogen atoms of the electron transport material contained in the electron injection suppressing layer EIS. For example, the second electron injection enhancing layer EIE2 may include an N-containing heterocyclic compound including three ring formation nitrogen atoms as the electron transport material. The electron transport materials contained in the first and second electron injection enhancing layers EIE1 and EIE2 may be the same.

Ratios of the Liq, LiF, $Li_2O$, CsF, BaF, BaO, $Al_2O_3$, NaCl, RbCl, or RbI to the electron transporting materials that are provided in the first and second electron injection enhancing layers EIE1 and EIE2 may be the same within the range that satisfies the ratio of 5:5 to 7:3 or be different from each other. Referring to FIGS. 5 to 7, the first electron injection enhancing layer EIE1 may contact the first light emitting layer EML1. The first light emitter EU1 may further include a first hole transport region HTR1 between the first electrode EL1 and the first light emitting layer EML1. The first hole transport region HTR1 may include at least one of a hole injection layer and a hole transport layer. The hole transport region HTR1 may further include at least one of a hole buffer layer and an electron stop layer. The hole transport region HTR1 may include a single layer made of a single material, a single layer made of materials different from each other, or a multi-layered structure including a plurality of layers made of materials different from each other.

For example, the first hole transport region HTR1 may be a single layer structure formed of a plurality of different materials or a structure of the hole injection layer/the hole transport layer, the hole injection layer/the hole transport layer/the buffer layer, the hole injection layer/the hole buffer layer, the hole transport layer/the hole buffer layer, or the hole injection layer/the hole transport layer/the electron stop layer, which are successively laminated from the first electrode EL1.

The first hole transport region HTR1 may be formed by using a general method that is known in the technical fields. For example, the first hole transport region HTR1 may be formed by using a suitable method such as a vacuum deposition method, a spin coating method, a casting method, a Langmuir-Blodgett (LB) method, an inject printing method, a laser printing method, or a laser induced thermal imaging (LITI) method.

The first electron injection enhancing layer EIE1 may include the electron transport material. Thus, the first light emitter EU1 need not include a separate electron transport layer other than the first electron injection enhancing layer EIE1. For example, only the first electron injection enhancing layer EIE1 may be disposed between the first light emitting layer EML1 and the first charge generation layer CGL1.

The second electron injection enhancing layer EIE2 may contact the third light emitting layer EML3. The third light emitter EU3 may further include a third hole transport region HTR3 between the first charge generation layer CGL1 and the third emitting layer EML3. The descriptions with respect to the first hole transport region HTR1 may be applied to the third hole transport region HTR3. Accordingly, descriptions thereof will not be repeated.

The second electron injection enhancing layer EIE2 may include the electron transport material. Thus, the third light emitter EU3 need not include a separate electron transport layer other than the second electron injection enhancing layer EIE2. For example, only the second electron injection enhancing layer EIE2 may be disposed between the third light emitting layer EML3 and the second charge generation layer CGL2.

The electron injection suppressing layer EIS may contact the second light emitting layer EML2. The second light emitter EU2 may further include a second hole transport region HTR2 between the second charge generation layer CGL2 and the second emitting layer EML2. The descriptions with respect to the first hole transport region HTR1 may be applied to the second hole transport region HTR2. Accordingly, descriptions thereof will not be repeated.

The second light emitter EU2 may further include an electron transport layer ETL between the second electrode EL2 and the electron injection suppressing layer EIS. The electron transport layer ETL may be a suitable layer that is well-known in the technical fields. Since the electron injection suppressing layer EIS includes the electron transport material, a separate electron transport layer need not be disposed between the second electrode EL2 and the electron injection suppressing layer EIS. In some implementations, the electron injection layer may be disposed between the second electrode EL2 and the electron injection suppressing layer EIS.

The first, second, and third hole transport regions HTR1, HTR2, and HTR3 may be the same or different from each other.

The first charge generation layer CGL1 may include an n-type charge generation layer n-CGL1 and a p-type charge generation layer p-CGL1. The p-type charge generation layer p-CGL1 may be disposed on the n-type charge generation layer n-CGL1.

The first charge generation layer CGL1 may have a structure in which the n-type charge generation layer n-CGL1 and the p-type charge generation layer p-CGL1 are bonded to each other. The n-type charge generation layer n-CGL1 may be disposed more adjacent to the first electrode EL1 than to the second electrode EL2. The p-type charge generation layer p-CGL1 may be disposed more adjacent to the second electrode EL2 than to the first electrode EL1. The n-type charge generation layer n-CGL1 may supply electrons to the first light emitting layer EML1, and the p-type charge generation layer p-CGL1 may supply holes to the second light emitting layer EML2 or the third light emitting layer EML3. A buffer layer may be further disposed between the n-type charge generation layer n-CGL1 and the p-type charge generation layer p-CGL1. The first charge generation layer CGL1 may be disposed between the first light emitter EU1 and the second light emitter EU2 to provide charges to each of the light emitting layers, thereby improving light emitting efficiency and reducing a driving voltage.

The second charge generation layer CGL2 may include an n-type charge generation layer n-CGL2 and a p-type charge generation layer p-CGL2. The second charge generation layer CGL2 may have a structure in which the n-type charge generation layer n-CGL2 and the p-type charge generation layer p-CGL2 are bonded to each other. The n-type charge generation layer n-CGL2 may supply electrons to the third light emitting layer EML2, and the p-type charge generation layer p-CGL2 may supply holes to the second light emitting layer EML2. A buffer layer may be further disposed between the n-type charge generation layer n-CGL2 and the p-type charge generation layer p-CGL2. The second charge generation layer CGL2 may be disposed between the second light emitter EU2 and the third light emitter EU3 to provide charges to each of the light emitting layers, thereby improving the light emitting efficiency and reducing the driving voltage.

Two light emitting layers of the first, second, and third light emitting layers EML1, EML2, and EML3 may be blue light emitting layers that emit blue light, and the remaining one light emitting layer of the first, second, and third light emitting layers EML1, EML2, and EML3 may be a light emitting layer that emits white light by being mixed with the blue light. For example, the organic electroluminescence element OEL may be a white organic electroluminescence element including two blue light emitters.

The two blue light emitting layers may emit blue light having the same wavelength band or blue light having wavelength bands different from each other. For example, one of the two blue light emitting layers may emit blue light having a wavelength band of about 440 nm to about 460 nm, and the other one of the two blue light emitting layer may emit blue light having a wavelength band of about 460 nm to about 490 nm. In some implementations, a portion of the wavelength bands may overlap each other.

In general, when the blue light emitting layer emits light having a short wavelength band, the blue light emitting layer may have a high light emitting energy level. Thus, energy that has not participated in the emission could act as a factor for dissociating organic materials within the light emitting layers. Thus, the blue light emitting layer may have a relatively shorter lifespan than a red light emitting layer, a green light emitting layer, or a yellow light emitting layer. Thus, the organic electroluminescence display device 10 according to an embodiment may provide the two blue light emitters to the organic electroluminescence element OEL to improve the lifespan limit of the blue light emitting layer.

Each of the second and third light emitting layers EML2 and EML3 may be a blue light emitting layer that emits blue light, and the first light emitting layer EML1 may be a light emitting layer that emits white light by being mixed with the blue light. When the second light emitting layer EML2 that is most adjacent to the second electrode EL2 is the blue light emitting layer emitting the blue light, an effect of the placement of the electron injection suppressing layer EIS may be maximized. As described above, if an amount of electrons injected into the blue light emitting layer were to be greater than the amount of electrons injected into each of the red light emitting layer, the green light emitting layer, and the yellow light emitting layer, a degree of the reduction of the lifespan may be large.

In some implementations, two light emitting layers of the first, second, and third light emitting layers EML1, EML2, and EML3 may be blue light emitting layers that emit blue light, and the remaining of the first, second, and third light emitting layers EML1, EML2, and EML3 may be a yellow light emitting layer that emits yellow light.

The organic electroluminescence element OEL may further include an organic capping layer CPL disposed on the second electrode EL2.

Two light emitting layers of the first, second, and third light emitting layers EML1, EML2, and EML3 may be blue light emitting layers that emit blue light, and the remaining one of the first, second, and third light emitting layers EML1, EML2, and EML3 may include a first sub light emitting layer EML-a and a second sub light emitting layer EML-b, as illustrated in FIG. 7. One of the first and second sub light emitting layers EML-a and EML-b may be a red light emitting layer that emits red light, and the other one of the first and second sub light emitting layers EML-a and EML-b may be a green light emitting layer that emits green light.

The first sub light emitting layer EML-a and the second sub light emitting layer EML-b may be successively laminated in the third direction DR3. The first sub light emitting layer EML-a and the second sub light emitting layer EML-b may contact each other. If desired, a layer such as a buffer layer may be disposed between the first sub light emitting layer EML-a and the second sub light emitting layer EML-b.

Figure 8:
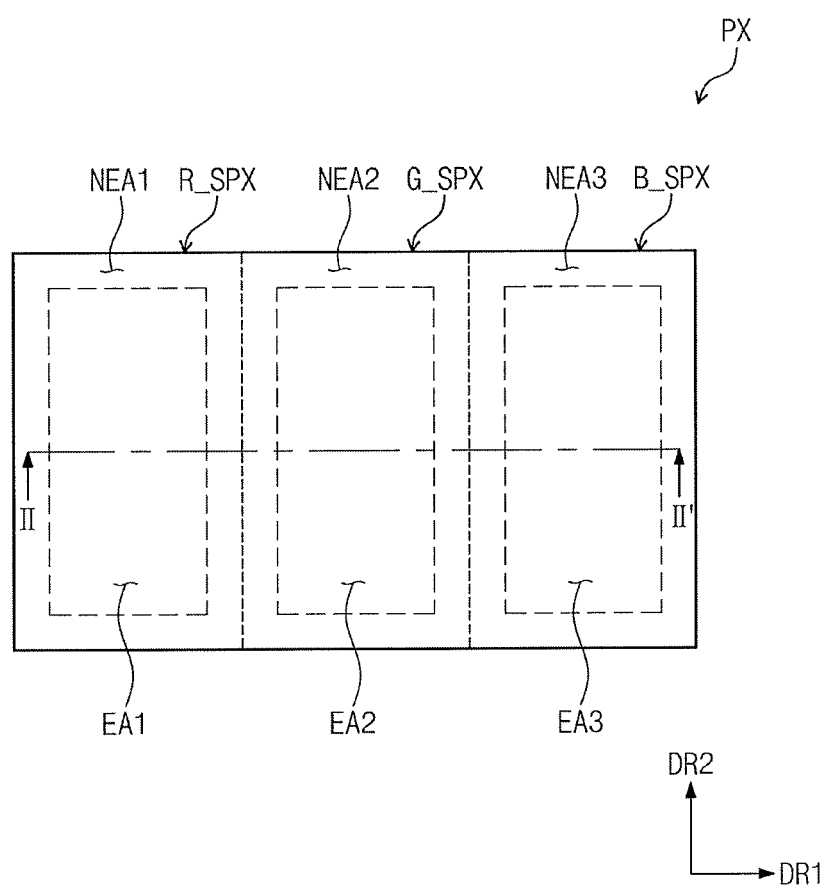
FIG. 8 illustrates a schematic plan view illustrating one of pixels provided in the organic electroluminescence display device according to an embodiment.

FIG. 8 illustrates a schematic plan view of one of pixels provided in the organic electroluminescence display device according to an embodiment.

As described above, the organic electroluminescence display device 100 according to an embodiment may include a plurality of pixels (see reference symbol PX of FIG. 1). Referring to FIG. 8, each of the pixels PX includes a plurality of sub pixels SPX. Each of the sub pixels SPX may be divided into an emission area and a non-emission area. For example, each of the pixels PX may include a red sub pixel R_SPX, a green sub pixel G_SPX, and a blue sub pixel B_SPX. The red sub pixel R_SPX emits red light, the green sub pixel G_SPX emits green light, and the blue sub pixel B_SPX emits blue light.

In some implementations, the red sub pixel R_SPX, the green sub pixel G_SPX, and the blue sub pixel B_SPX may be successively connected to each other in the first direction DR1 in FIG. 8. For example, the red sub pixel R_SPX, the green sub pixel G_SPX, and the blue sub pixel B_SPX may be successively connected to each other in the second direction DR2, or the red sub pixel R_SPX, the green sub pixel G_SPX, and the blue sub pixel B_SPX may be successively connected to each other in the first direction DR1 on a plane.

In this specification, the term "on the plane" may be understood with reference to the organic electroluminescence display device 10 being viewed in a thickness direction (e.g., the direction DR4 of FIG. 1).

In some implementations, the red sub pixel R_SPX, the green sub pixel G_SPX, and the blue sub pixel B_SPX may have the same shape and size on the plane in FIG. 8. In some implementations, the shapes and sizes may be different from each other.

Each of the pixels PX may be divided into a red emission area EA1, a green emission area EA2, and a blue emission area EA3. The red sub pixel R_SPX may be divided into a red emission area EA1 and a first non-emission area. The green sub pixel G_SPX may be divided into a green emission area EA1 and a second non-emission area. The blue sub pixel R_BPX is divided into a blue emission area EA1 and a third non-emission area. The red emission area EA1, the green emission area EA2, and the blue emission area EA3 may be successively spaced apart from each other on the plane in the first direction. Each of the red emission area EA1, the green emission area EA2, and the blue emission area EA3 may have a rectangular shape having a length in the third direction DR3 that is greater than a length in the first direction DR1. In some implementations, the red emission area EA1, the green emission area EA2, and the blue emission area EA3 may have shapes other than that illustrated in FIG. 7.

Figure 9:
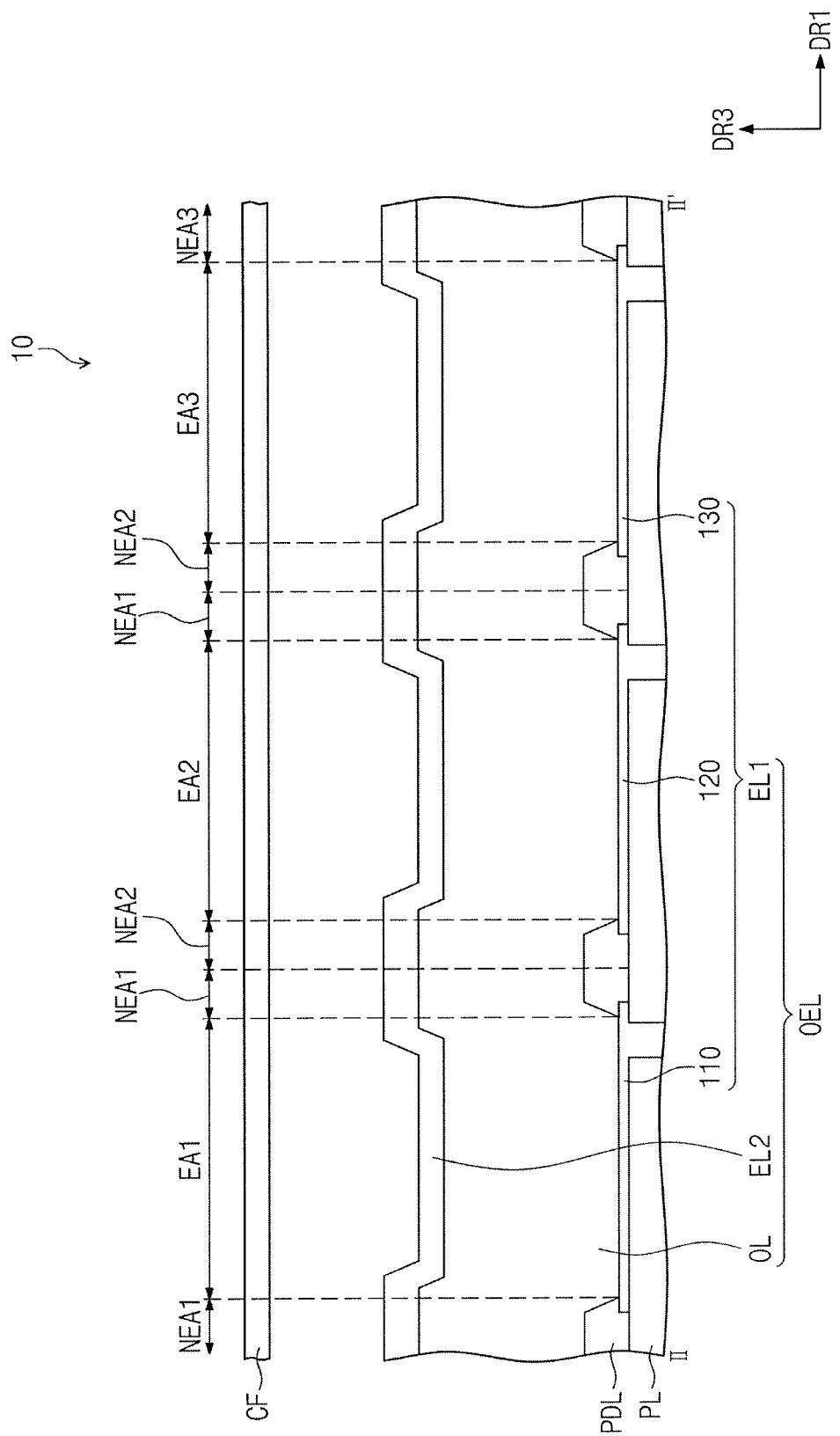
FIG. 9 illustrates a schematic cross-sectional view taken along line II-II' of FIG. 8.

FIG. 9 illustrates a schematic cross-sectional view taken along line II-II' of FIG. 8.

Referring to FIGS. 8 and 9, the emission areas EA1, EA2, and EA3 and the non-emission areas NEA1, NEA2, and NEA3 of each of the pixels PX may be defined by a pixel defining layer PDL.

The first electrode EL1 may include a first sub electrode 110 disposed on the red emission area EA1, a second sub electrode 120 disposed on the green emission area EA2, and a third sub electrode 130 disposed on the blue emission area EA3. The first sub electrode 110, the second sub electrode 120, and the third sub electrode 130 may be, for example, spaced apart from each other in the first direction DR1.

The first light emitter EU1, the first charge generation layer CGL1, the second light emitter EU2, and the second electrode EL2 may be commonly disposed on the red emission area EA1, the green emission area EA2, and the blue emission area EA3. For example, the first light emitter EU1, the first charge generation layer CGL1, the second light emitter EU2, and the second electrode EL2 may be commonly disposed on the red emission area EA1, the first non-emission area NEA1, the green emission area EA2, the second non-emission area NEA2, the blue emission area EA3, and the third non-emission area NEA3. When the second charge generation layer CGL2 further includes the third light emitter EU3, the second charge generation layer CGL2 and the third light emitter EU2 may also be commonly disposed on the red emission area EA1, the green emission area EA2, and the blue emission area EA3.

The organic electroluminescence display device 10 according to an embodiment may include a color filter CF disposed on the organic electroluminescence element OEL. The color filter CF may be disposed to be spaced apart from the organic electroluminescence element OEL in the third direction DR3. The color filter CF may be disposed to be spaced apart from the second electrode EL2 of the organic electroluminescence element OEL.

As described above, the organic electroluminescence element OEL may be a white organic electroluminescence element. The organic electroluminescence display device 10 according to an embodiment may realize full colors when the white light emitted from the organic electroluminescence element OEL passes through the color filter CF.

Figure 10:
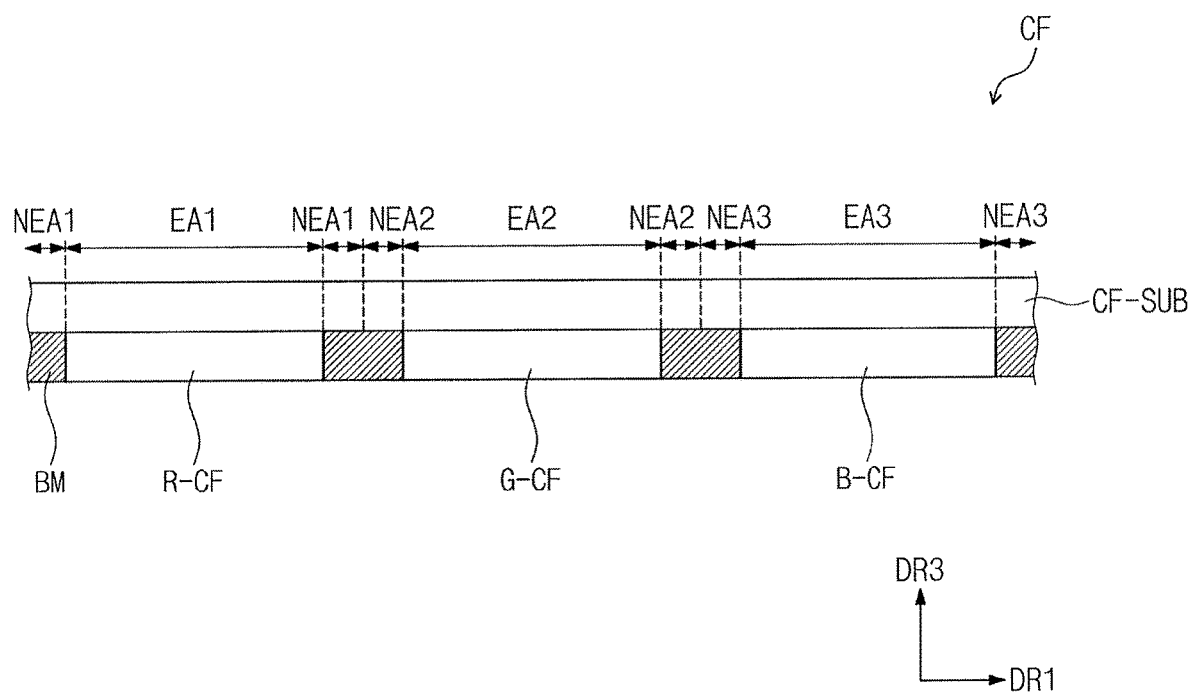
FIG. 10 illustrates a detailed cross-sectional view of a color filter of FIG. 9.

FIG. 10 illustrates a detailed cross-sectional view of the color filter of FIG. 9.

Referring to FIGS. 8 to 10, the color filter CF may include a color filter substrate CF-SUB and a plurality of sub color filters R-CF, G-CF, and B-CF disposed on a bottom surface of the color filter substrate CF-SUB. The bottom surface of the color filter substrate CF-SUB may be more adjacent to the organic electroluminescence device OEL than is a top surface of the color filter substrate CF-SUB.

The bottom surface of the color filter substrate CF-SUB may include the red sub color filter R-CF through which only the red light of the white light emitted from the organic electroluminescence device OEL passes, the green sub color filter G-CF through which only the green light of the white light passes, and the blue sub color filter B-CF through which only the blue light of the white light passes. The red sub color filter R-CF may be disposed to correspond to the red emission area EA1, the green sub color filter G-CF may be disposed to correspond to the green emission area EA2, and the blue sub color filter B-CF may be disposed to correspond to the blue emission area EA3. A black matrix BM may be disposed between the plurality of sub color filters R-CF, G-CF, and B-CF.

The organic electroluminescence element OEL may be a blue organic electroluminescence element that emits blue light. For example, each of the first light emitting layer EML1 and the second light emitting layer EML2 may be a blue light emitting layer that emits blue light. When the organic electroluminescence element OEL further includes the third light emitter EU3, for example, each of the first, second, and third light emitting layers EML1, EML2, and EML3 may be a blue light emitting layer that emits blue light.

The first light emitting layer EML1 may emit first blue light having a first wavelength band, the second light emitting layer EML2 may emit second blue light having a second wavelength band, and the third light emitting layer EML3 may emit third blue light having a third wavelength band. The first, second, and third wavelength bands may be the same or different from each other. For example, the first, second, and third wavelength bands may have peak wavelengths different from each other, respectively.

For example, one of the first, second, and third wavelength bands may range of about 440 nm to about 460 nm, one of the remaining two wavelength bands may range of about 460 nm to about 470 nm, and the other wavelength band may range of about 470 nm to about 480 nm. In some implementations, the first and second wavelength bands may partially overlap each other. For example, all the first and second wavelength bands may have a wavelength of about 460 nm. The second and third wavelength bands may also partially overlap each other. For example, all the second and third wavelength bands may have a wavelength of about 470 nm. The first and third wavelength bands may not partially overlap each other.

When third light emitting layers that emit blue light having wavelength bands different from each other are disposed, a blue light emitting peak may be more broadly distributed when compared to an organic electroluminescence device including only the blue light emitting layer that emits the blue light having a single wavelength band. Accordingly, color visibility at a side viewing angle may be improved.

Figure 11:
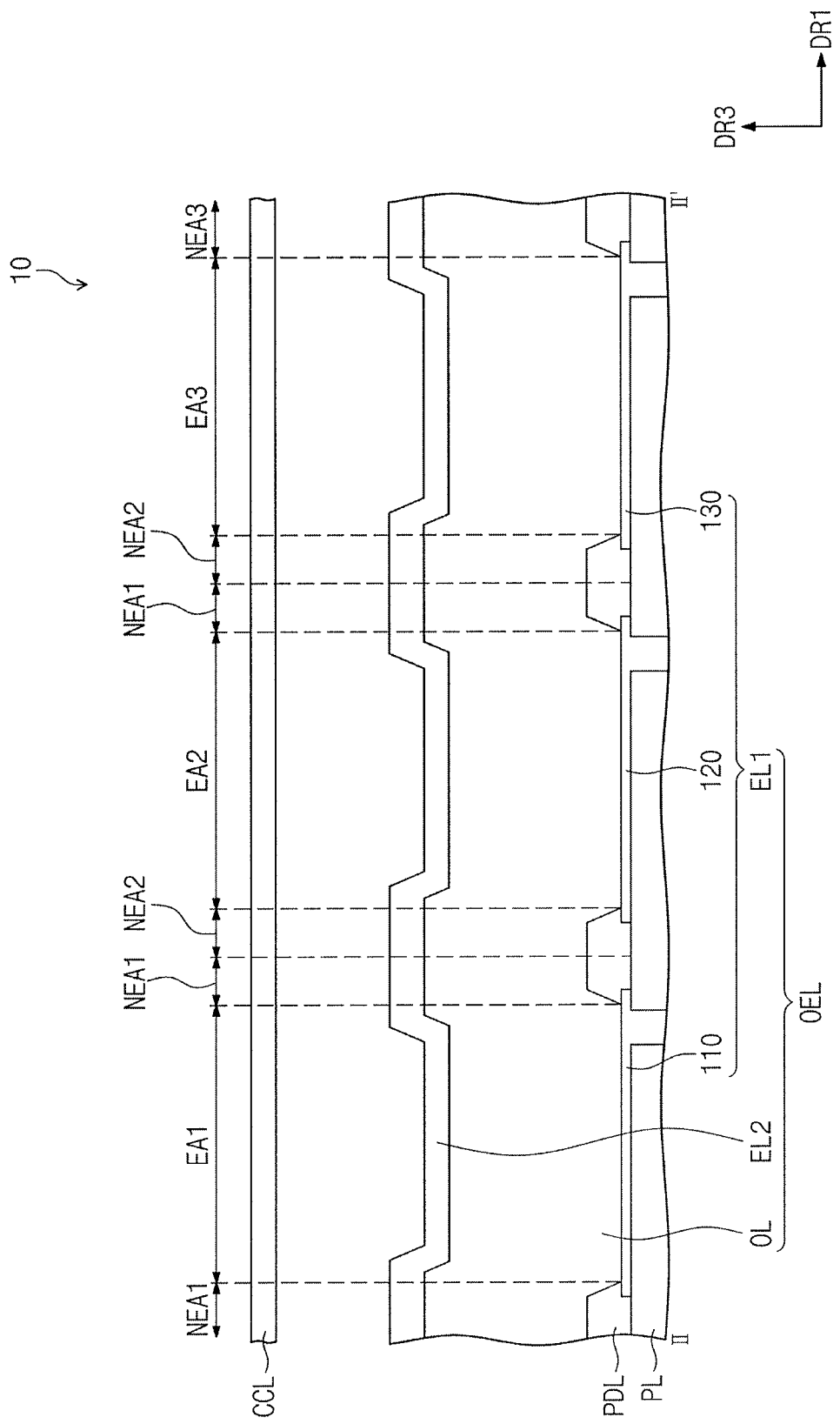
FIG. 11 illustrates a schematic cross-sectional view taken along line II-II' of FIG. 8.

FIG. 11 illustrates a schematic cross-sectional view taken along line II-II' of FIG. 8.

Referring to FIGS. 8 and 11, the organic electroluminescence display device 10 according to an embodiment may further include a color conversion layer CCL disposed on the organic electroluminescence element OEL. The color conversion layer CCL may be disposed to be spaced apart from the organic electroluminescence element OEL in the third direction DR3. The color conversion layer CCL may be disposed to be spaced apart from the second electrode EL2 of the organic electroluminescence element OEL.

As described above, the organic electroluminescence element OEL may be the blue organic electroluminescence element. The organic electroluminescence display device 10 according to an embodiment may realize full colors when the blue light emitted from the organic electroluminescence element OEL passes through the color conversion layer CCL.

Figure 12:
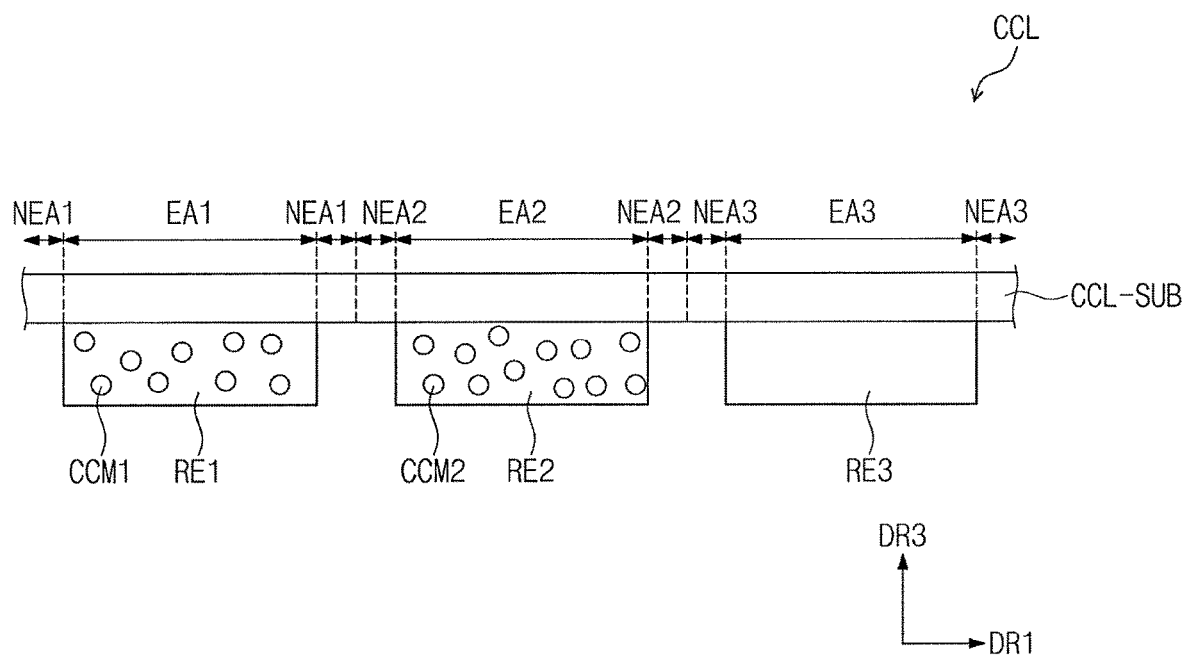
FIG. 12 illustrates a detailed cross-sectional view of a color conversion layer of FIG. 11.

FIG. 12 illustrate detailed cross-sectional views of the color conversion layer of FIG. 11 according to embodiments.

Figure 13:
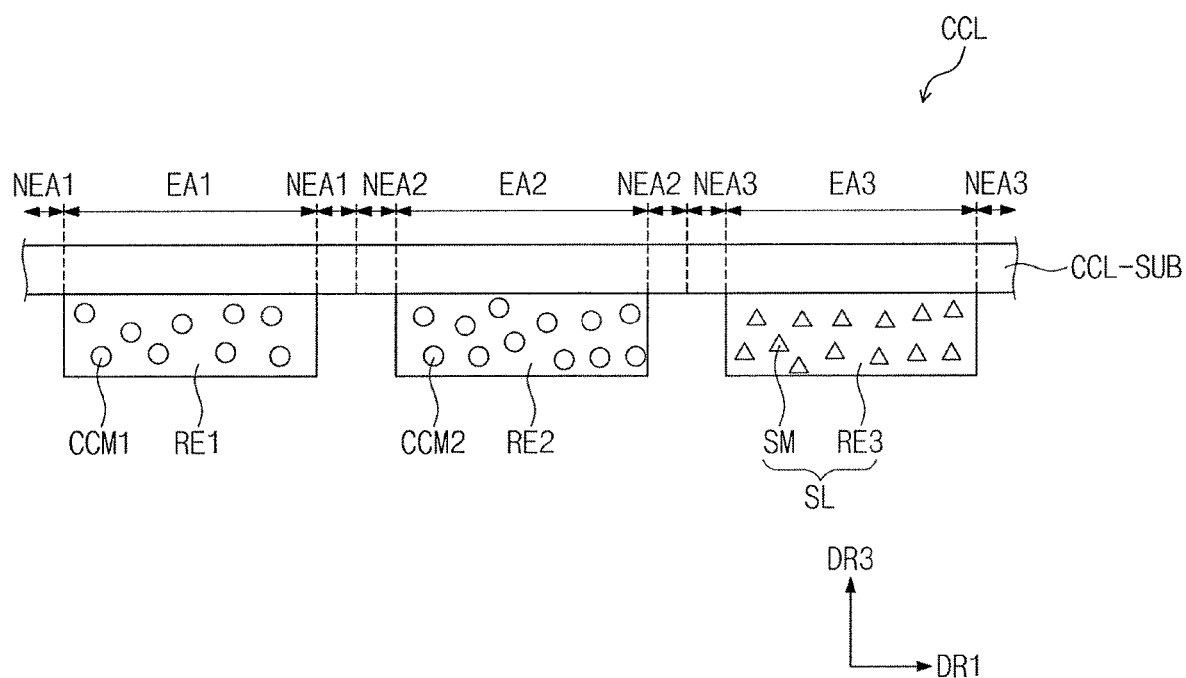
FIG. 13 illustrates a detailed cross-sectional view of the color conversion layer of FIG. 11.

Referring to FIGS. 12 and 13, the color conversion layer CCL may include resin layers RE1, RE2, and RE3 and color conversion materials CCM1 and CCM2. The color conversion materials CCM1 and CCM2 may be contained in the resin layers RE1, RE2, and RE3. The color conversion materials CCM1 and CCM2 may be dispersed in the resin layers RE1, RE2, and RE3. Each of the resin layers RE1, RE2, and RE3 may be a transmissive adhesion material. Each of the resin layers RE1, RE2, and RE3 may have elasticity to provide secure durability. Each of the resin layers RE1, RE2, and RE3 may use a material that does not absorb blue light. Examples of the resin layers RE1, RE2, and RE3 may include epoxy, silicon, acrylic-based polymer, a carbonate-based polymer, or a mixture thereof. In some implementations, the color conversion layer CCL may be a layer formed by dispersing the color conversion materials CCM1 and CCM2 in an organic solution.

The resin layers RE1, RE2, and RE3 may be disposed on the red emission area EA1, the green emission area EA2, and the blue emission area EA3, respectively. The resin layer RE may include a first resin layer RE1 disposed on the red emission area EA1, a second resin layer RE2 disposed on the green emission area EA2, and a third resin layer RE3 disposed on the blue emission area EA3. The first, second, and third rein layers RE1, RE2, and RE3 may be the same or different from each other. A black matrix may be disposed between the resin layers RE1, RE2, and RE3.

In some implementations, the resin layers RE1, RE2, and RE3 may not be disposed on the first, second, and third non-emission areas NEA1, NEA2, and NEA3. In some implementations, a portion of the resin layers RE1, RE2, and RE3 may be disposed on at least a portion of the first, second, and third non-emission areas NEA1, NEA2, and NEA3.

The color conversion layer CCL may include a color conversion layer substrate CCL-SUB. The resin layers RE1, RE2, and RE3 may be disposed on a bottom surface of the color conversion layer substrate CCL-SUB. The bottom surface of the color conversion layer substrate CCL-SUB may be more adjacent to the organic electroluminescent device OEL than is a top surface of the color conversion layer substrate CCL-SUB.

The color conversion layer substrate CCL-SUB may be a transparent substrate, for example, a glass substrate. The color conversion layer substrate CCL-SUB may be commonly disposed on the red emission area EA1, the first non-emission area NEA1, the green emission area EA2, the second non-emission area NEA2, the blue emission area EA3, and the third non-emission area NEA3.

The color conversion layer CCL may include a first color conversion material CCM1 disposed in the red emission area EA1 and a second color conversion material CCM2 disposed in the green emission area EA2. The first color conversion material CCM1 may be dispersed in the first resin layer RE1. The second color conversion material CCM2 may be dispersed in the second resin layer RE2.

The color conversion materials CCM1 and CCM2 may convert a wavelength of the blue light emitted from the blue organic electroluminescence element OEL. Each of the first and second color conversion materials CCM1 and CCM2 may include at least one of an inorganic phosphor, an organic phosphor, a quantum dot, and an organic dye.

In some implementations, the color conversion material may not disposed on the blue emission area EA3. Thus, the blue light emitted from the blue organic electroluminescence element OEL may be emitted as it is without being converted. Only the third resin layer RE3 in which the color conversion material is not provided may be disposed on the blue emission area EA3. In some implementations, the color conversion layer CCL may further include a scattering layer SL disposed in the blue emission area EA3. The scattering layer SL may scatter the blue light emitted from the blue organic electroluminescence element OEL such that an emission peak of the blue light is more broadly distributed. The scattering layer SL may be disposed at a level in which intensity of the blue light is not significantly lowered. When the emission peak of the blue light is not broadened to a desired level, the scattering layer SL may be disposed to more broadly distribute the emission peak of the blue light.

The scattering layer SL may include the third resin layer RE3 and a scattering material SM contained in the third resin layer RE3. The scattering material SM may be dispersed in the third resin layer RE3. The third resin layer RE3 may be the same as the first resin layer RE1 disposed on the red emission area EA1 and the second resin layer RE2 disposed on the green emission area EA2. The scattering material SM may be a suitable scattering material. Examples of the scattering material SM may include titanium oxide ($TiO_2$), zirconium oxide ($ZrO_2$), zinc oxide (ZnO), or aluminum oxide ($Al_2O_3$).

In the organic electroluminescence display device 10 according to an embodiment, the electron injection suppressing layer EIS may be disposed on the second light emitter EU3 that is disposed adjacent to the second electrode EL2, and the electron injection enhancing layer EIE1 may be disposed on the first light emitter EU1 that is disposed to be spaced apart from the second electrode EL2 to reduce an imbalance in amount of electrons injected between the light emitters EU1 and EU2. As a result, a balance in emission lifespan of the light emitters EU1 and EU2 may be realized, and thus, a color lifespan and efficiency of the organic electroluminescence display device 10 may be improved. Also, an emission lifespan of the organic electroluminescence element OEL may be improved.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

An organic electroluminescence display device, in which a first electrode, a first light emitter, a first charge generation layer, a third light emitter, a second charge generation layer, a second light emitter, and a second electrode were successively laminated, according to an embodiment was manufactured. Each of the a first electron injection enhancing layer, a second electron injection enhancing layer, and an electron injection suppressing layer was formed to contain an electron transport material and Liq.

A ratio of the electron transport material to Liq in the first electron injection enhancing layer was about 5:5. A ratio of the electron transport material to Liq in the second electron injection enhancing layer was about 5:5. A ratio of the electron transport material to Liq in the electron injection suppressing layer was about 3:7.

The electron transport materials contained in the first electron injection enhancing layer, the second electron injection enhancing layer, and the electron injection suppressing layer were the same.

Comparison Example 1

Comparison Example 1 was the same as Embodiment 1 except that the ratio of the electron transport material to Liq in the electron injection suppressing layer was about 5:5.

Comparison Example 2

In comparison Example 2, the ratios of the electron transport material to Liq in the first electron injection enhancing layer, the second electron injection enhancing layer, and the electron transport suppressing layer were all about 5:5

Experimental Example 1

Figure 14:
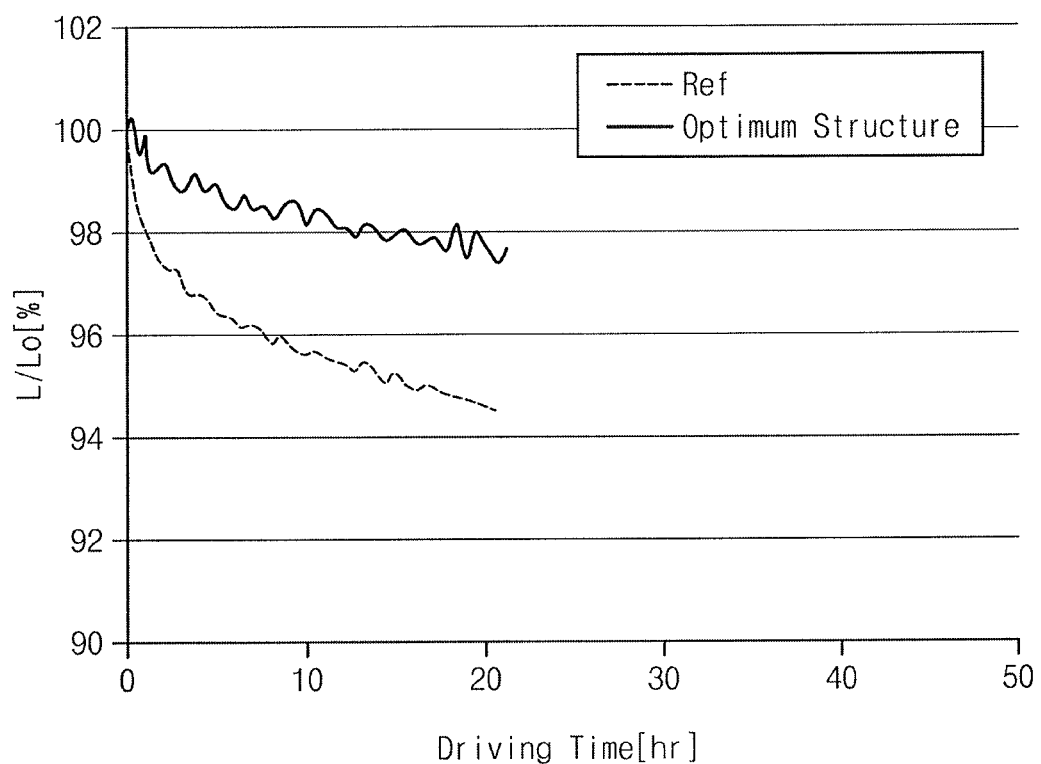
FIG. 14 illustrates a graph illustrating a variation in emission lifespan depending on a driving time of each of organic electroluminescence display devices according to Embodiment 1 and Comparative Example 1.

A variation in emission life depending on a driving time of each of organic electroluminescence display devices according to Embodiment 1 and Comparison Example 1 was illustrated as a graph of FIG. 14. A reference symbol L0 of FIG. 14 represents an initial brightness value, and a reference symbol L represents a brightness value according to a driving time. Referring to FIG. 14, it may be seen that the organic electroluminescence display device according to the embodiment showed a superior emission lifespan.

Experimental Example 2

The ratio of the electron transport material and Liq that were contained in at least one of the first electron injection enhancing layer, the second electron injection enhancing layer, and the electron injection suppressing layer in Embodiment 1, were changed to manufacture organic electroluminescence display devices according to Comparison Examples 1 and 2. Efficiency according to Embodiment 1 and Comparison Examples 1 and 2 was illustrated in Table 1 below.

TABLE 1

|  | Ratio of electron transport material to Liq in first electron injection enhancing layer | Ratio of electron transport material to Liq in second electron injection enhancing layer | Ratio of electron transport material to Liq in electron injection suppressing layer | Efficiency (Cd/A) |
| --- | --- | --- | --- | --- |
| Embodiment 1 | 5:5 | 5:5 | 3:7 | 67.8 |
| Comparison Example 2 | 5:5 | 5:5 | 5:5 | 73.7 |
| Comparison Example 3 | 3:7 | 3:7 | 3:7 | 74.0 |

In Table 1, it is seen that the organic electroluminescence display device according to the embodiment is improved in efficiency.

In the organic electroluminescence device according to the embodiment, the color lifespan may be improved.

In the organic electroluminescence display device according to the embodiment, the efficiency may be improved.

In the organic electroluminescence display device according to the embodiment, the emission lifespan may be improved.

Although the embodiment is described with reference to the accompanying drawings, those with ordinary skill in the technical field pertains will be understood that the present disclosure can be carried out in other specific forms without changing the technical idea or essential features. Thus, the above-disclosed embodiments are to be considered illustrative and not restrictive.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. An organic electroluminescence display device, comprising:
a first electrode;
a first light emitter on the first electrode, the first light emitter including a first light emitting layer;
a first charge generation layer disposed on the first light emitter;
a second light emitter on the first charge generation layer, the second light emitter including a second light emitting layer; and
a second electrode on the second light emitter,
wherein the first light emitter includes a first electron injection enhancing layer on the first light emitting layer,
the second light emitter includes an electron injection suppressing layer on the second light emitting layer, the electron injection suppressing layer having electron mobility less than that of the first electron injection enhancing layer, and
wherein:
each of the first electron injection enhancing layer and the electron injection suppressing layer includes Liq, LiF, $Li_2O$, CsF, BaF, BaO, $Al_2O_3$, NaCl, RbCl, or RbI, and an electron transport material,
a ratio of the Liq, LiF, $Li_2O$, CsF, BaF, BaO, $Al_2O_3$, NaCl, RbCl, and RbI to the electron transport material of the first electron injection enhancing layer is about 5:5 to about 7:3, and
a ratio of the Liq, LiF, $Li_2O$, CsF, BaF, BaO, $Al_2O_3$, NaCl, RbCl, or RbI to the electron transport material of the electron injection suppressing layer is about 4:6 to about 2:8.

2. The organic electroluminescence display device as claimed in claim 1, wherein:
the electron transport material includes an N-containing heterocyclic compound,
the N-containing heterocyclic compound contained in the electron injection suppressing layer includes one ring formation nitrogen atom, and
the N-containing heterocyclic compound contained in the first electron injection enhancing layer includes three ring formation nitrogen atoms.

3. The organic electroluminescence display device as claimed in claim 1, wherein each of the first electron injection enhancing layer and the electron injection suppressing layer includes Liq and the electron transport material.

4. The organic electroluminescence display device as claimed in claim 1, further comprising:
a second charge generation layer between the first charge generation layer and the second light emitter; and
a third light emitter between the first charge generation layer and the second charge generation layer and comprising a third light emitting layer, wherein the third light emitter is on the third light emitting layer and includes a second electron injection enhancing layer having electron mobility greater than that of the electron injection suppressing layer.

5. The organic electroluminescence display device as claimed in claim 4, wherein:
the second electron injection enhancing layer includes Liq, LiF, $Li_2O$, CsF, BaF, BaO, $Al_2O_3$, NaCl, RbCl, or RbI, and an electron transport material,
a ratio of Liq, LiF, $Li_2O$, CsF, BaF, BaO, $Al_2O_3$, NaCl, RbCl, or RbI to the electron transport material of the second electron injection enhancing layer is about 5:5 to about 7:3.

6. The organic electroluminescence display device as claimed in claim 4, wherein the electron transport material includes an N-containing heterocyclic compound including three ring formation nitrogen atoms.

7. The organic electroluminescence display device as claimed in claim 4, wherein:
two light emitting layers of the first, second, and third light emitting layers include blue light emitting layers that emit blue light, and
a remaining one of the first, second, and third light emitting layers includes a light emitting layer that emits white light by being mixed with the blue light.

8. The organic electroluminescence display device as claimed in claim 7, wherein:
the second light emitting layer and the third light emitting layer include the blue light emitting layers that emit the blue light, and
the first light emitting layer includes the light emitting layer that emits the white light by being mixed with the blue light.

9. The organic electroluminescence display device as claimed in claim 4, wherein:
two light emitting layers of the first, second, and third light emitting layers include blue light emitting layers that emit blue light, and
a remaining one of the first, second, and third light emitting layers includes a yellow light emitting layer that emits yellow light.

10. The organic electroluminescence display device as claimed in claim 4, wherein:
two light emitting layers of the first, second, and third light emitting layers include blue light emitting layers that emit blue light, and
a remaining one of first, second, and third light emitting layers includes a first sub light emitting layer and a second sub light emitting layer,
one of the first and second sub light emitting layers includes a red light emitting layer that emits red light, and
another one of the first and second sub light emitting layers includes a green light emitting layer that emits green light.

11. The organic electroluminescence display device as claimed in claim 4, further including a color filter spaced apart from the second electrode.

12. The organic electroluminescence display device as claimed in claim 4, wherein each of the first, second, and third light emitting layers includes a blue light emitting layer that emits blue light.

13. The organic electroluminescence display device as claimed in claim 12, wherein:
the first light emitting layer emits a first blue light having a first wavelength band,
the second light emitting layer emits a second blue light having a second wavelength band, and
the third light emitting layer emits a third blue light having a third wavelength band.

14. The organic electroluminescence display device as claimed in claim 13, wherein peak wavelengths of the first, second, and third wavelength bands are different from each other.

15. The organic electroluminescence display device as claimed in claim 12, further including a color conversion layer spaced apart from the second electrode.

16. The organic electroluminescence display device as claimed in claim 15, wherein the color conversion layer includes:
a resin layer; and
a color conversion material contained in the resin layer,
the color conversion material including at least one of an inorganic phosphor, an organic phosphor, a quantum dot, and an organic dye.

17. The organic electroluminescence display device as claimed in claim 1, wherein:
the first electrode includes a reflective electrode or a transflective electrode, and
the second electrode includes a transmissive electrode.

18. The organic electroluminescence display device as claimed in claim 1, wherein the electron transport material includes an N-containing heterocyclic compound.

19. The organic electroluminescence display device as claimed in claim 18, wherein a number of ring formation nitrogen atoms of the N-containing heterocyclic compound contained in the electron injection suppressing layer is less than a number of ring formation nitrogen atoms of the N-containing heterocyclic compound contained in the first electron injection enhancing layer.

* * * * *